United States Patent
Afzali-Ardakani et al.

(10) Patent No.: US 9,620,726 B2
(45) Date of Patent: Apr. 11, 2017

(54) HYBRID JUNCTION FIELD-EFFECT TRANSISTOR AND ACTIVE MATRIX STRUCTURE

(71) Applicant: International Business Machines Corporation, Armonk, NY (US)

(72) Inventors: Ali Afzali-Ardakani, Ossining, NY (US); Tze-Chiang Chen, Yorktown Heights, NY (US); Bahman Hekmatshoartabari, White Plains, NY (US); Ghavam G. Shahidi, Pound Ridge, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/884,744

(22) Filed: Oct. 15, 2015

(65) Prior Publication Data

US 2016/0035989 A1 Feb. 4, 2016

Related U.S. Application Data

(62) Division of application No. 14/184,488, filed on Feb. 19, 2014, now Pat. No. 9,166,181.

(51) Int. Cl.
| | |
|---|---|
| *H01L 51/05* | (2006.01) |
| *H01L 29/66* | (2006.01) |
| *H01L 27/28* | (2006.01) |
| *H01L 27/32* | (2006.01) |
| *H01L 51/00* | (2006.01) |

(52) U.S. Cl.
CPC ........ *H01L 51/0508* (2013.01); *H01L 27/286* (2013.01); *H01L 27/326* (2013.01); *H01L 27/3244* (2013.01); *H01L 27/3274* (2013.01); *H01L 29/66742* (2013.01); *H01L 51/002* (2013.01); *H01L 51/0021* (2013.01)

(58) Field of Classification Search
CPC .......... H01L 51/0508; H01L 29/66742; H01L 27/286; H01L 27/3274; H01L 51/002; H01L 51/0021; H01L 27/3244; H01L 27/326

See application file for complete search history.

(56) References Cited

U.S. PATENT DOCUMENTS

| | | |
|---|---|---|
| 6,975,293 B2 | 12/2005 | Yen |
| 7,423,372 B2 | 9/2008 | Kwak |

(Continued)

FOREIGN PATENT DOCUMENTS

| | | |
|---|---|---|
| JP | 2006303453 | 11/2006 |
| TW | 201324886 | 6/2013 |

OTHER PUBLICATIONS

Samarenda P. Singh et al., Electrical characteristics of zinc oxide-organic semiconductor lateral heterostructure based hybrid field-effect bipolar transistors, Applied Physics Letters vol. 98, Issue 7, Feb. 2011 (4 pages).

*Primary Examiner* — Long Pham
(74) *Attorney, Agent, or Firm* — Louis J. Percello; Otterstedt, Ellenbogen & Kammer, LLP

(57) ABSTRACT

Junction field-effect transistors including inorganic channels and organic gate junctions are used in some applications for forming high resolution active matrix displays. Arrays of such junction field-effect transistors are electrically connected to thin film switching transistors and provide high drive currents for passive devices such as organic light emitting diodes.

7 Claims, 18 Drawing Sheets

(56) References Cited

U.S. PATENT DOCUMENTS

| | | |
|---|---|---|
| 7,507,613 B2 | 3/2009 | Kawai |
| 7,858,975 B2 | 12/2010 | Kymissis |
| 7,999,261 B2 | 8/2011 | Ahn |
| 8,217,386 B2 | 7/2012 | Rinzler |
| 8,445,336 B2 | 5/2013 | Yang |
| 8,497,504 B2 | 7/2013 | Arai |
| 2015/0236282 A1 | 8/2015 | Afzali-Ardakani |

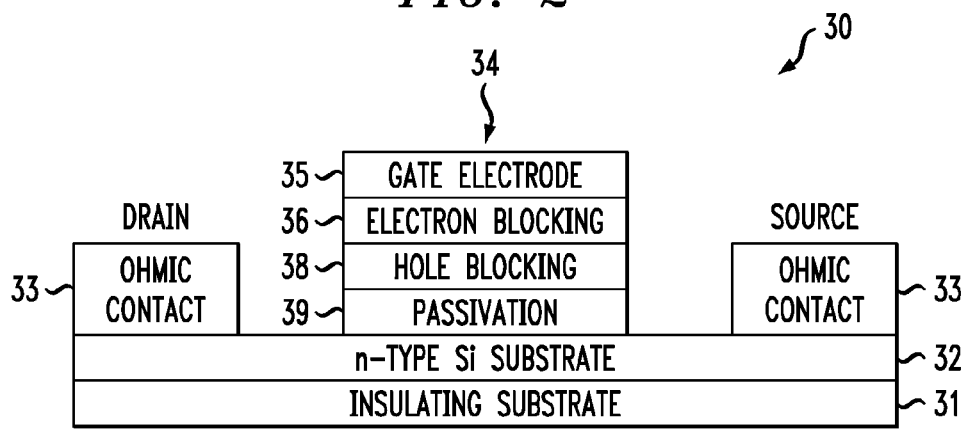
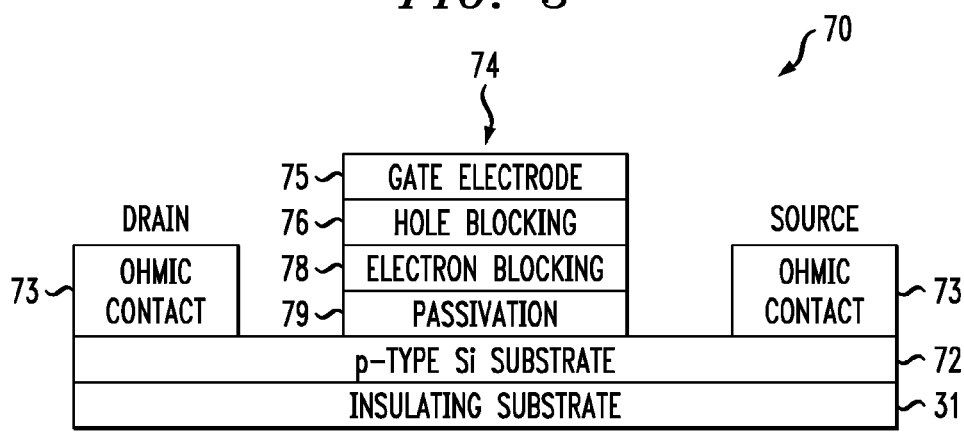
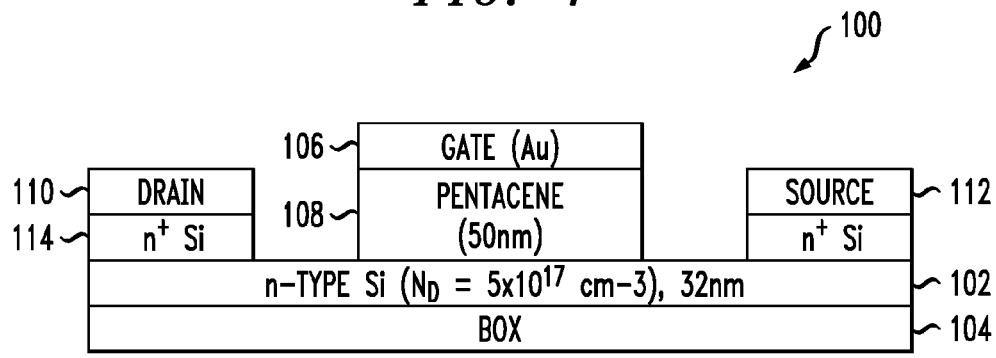

HYBRID JUNCTION FIELD-EFFECT TRANSISTOR AND ACTIVE MATRIX STRUCTURE

CROSS-REFERENCE TO RELATED APPLICATIONS

This patent application is a divisional of U.S. patent application Ser. No. 14/184,488 filed Feb. 19, 2014, entitled "HYBRID JUNCTION FIELD-EFFECT TRANSISTOR AND ACTIVE MATRIX STRUCTURE." The complete disclosure of the aforementioned U.S. patent application Ser. No. 14/184,488 is expressly incorporated herein by reference in its entirety for all purposes.

FIELD

The present disclosure relates to thin-film electronic device structures and technology and, more particularly, to field-effect transistors, active matrix structures such as backplanes incorporating such transistors, and the fabrication of field-effect transistors and active matrix structures using both inorganic and organic materials.

BACKGROUND

Field-effect transistors include source, drain and gate structures. A biasing voltage applied across gate and source terminals allows the flow of charge carriers, namely electrons or holes, between source and drain. Junction field-effect transistors (JFETs) are characterized by doped channel regions and ohmic contacts forming the source and drain regions.

Active matrix devices such as displays (e.g. televisions, laptop monitors), imagers (e.g. x-ray imagers) and sensors typically use hydrogenated amorphous silicon (a-Si:H) and, in some applications, low-temperature poly-silicon (LTPS) thin-film transistor (TFT) backplanes on glass or, for flexible devices, clear plastic. However, for very high resolution applications (>1000 pixels per inch (ppi)), such as microdisplays or pico-projectors, the carrier mobility of a-Si:H (electron mobility of about 1 cm$^2$/Vs) is too low to provide sufficient drive current at short TFT channel widths. For applications requiring high drive current, such as active matrix organic light emitting diode (AMOLED) displays, it is necessary to shrink the gate length and/or increase the gate width of a-Si:H transistors. This leads to increasing the processing cost of a-Si:H active matrix circuits due to the relatively small gate lengths as well as a significant trade-off in display resolution due to larger gate widths. LTPS is more expensive than a-Si:H, but capable of providing higher drive currents. The device-to-device variation of threshold voltage and mobility in LTPS transistors requires compensation circuitry that limits the resolution of the active matrix. Single crystalline silicon (c-Si) has been used as an alternative for very high resolution backplanes, but processing c-Si can require high temperatures not compatible with glass substrates currently used in manufacturing a-Si:H or LTPS devices or clear plastic substrates that may be used.

Some existing displays have pixel densities of about 100 PPI (pixels per inch), each pixel including three RGB sub-pixels. Pixel dimensions of such devices may be about one hundred microns (100 μm). Such displays further include organic light emitting diodes (OLEDs) requiring a drive current of about 300 nA for a 100 μm pixel. Amorphous hydrogenated silicon thin film transistors (TFTs) having standard SiN$_x$ gate dielectrics are employed in conjunction with the OLEDs. Using such TFTs, resolutions greater than 150 PPI are difficult.

FIGS. 25A and 25B schematically illustrate amorphous hydrogenated silicon (a-Si:H) TFTs. The transistor 40 shown in FIG. 25A is back-channel etched and the transistor 60 shown in FIG. 25B is back-channel passivated. Both transistors 40, 60 are bottom-gate structures having undoped a-Si:H channels 42. Source/drain structures 44, gates 46 and gate dielectric (nitride) layers 48 are operatively associated with the channels. The gates 46 adjoin the substrate 50. In the embodiment of FIG. 25B, a nitride passivation layer 52 is formed on the channel layer 42. As the channels 42 are undoped, the source/channel/drain of each transistor forms an n/i/n junction. The off-current of the transistors is low partly due to hole mobility being much smaller than electron mobility. The low TFT mobility (less than 1 cm$^2$/Vs), however, limits the TFT application for high drive current and/or low voltage applications. The transistors 40, 60 are accordingly more suited for use as switching TFTs than driver TFTs in active matrix circuits. Poly-Si has higher mobility, but also higher off-current and can suffer from device-to-device threshold voltage ($V_T$) variation.

BRIEF SUMMARY

In accordance with the principles discussed herein, junction field-effect transistors, active matrix structures including such transistors, and methods relating to such transistors and active matrix structures are provided.

A junction field-effect transistor is disclosed that includes a doped inorganic semiconductor layer, a gate electrode, first and second ohmic contacts operatively associated with the inorganic semiconductor layer, and a gate junction structure operatively associated with the gate electrode. The gate junction structure is positioned between the gate electrode and the inorganic semiconductor layer and includes an organic semiconductor blocking layer for suppressing the injection of the charge carriers having a first charge type from the gate electrode into the inorganic semiconductor layer. The charge carriers having the first charge type correspond to majority carriers in the inorganic semiconductor layer.

An exemplary method includes obtaining a junction field-effect transistor including a doped inorganic semiconductor layer, a gate electrode, first and second ohmic contacts operatively associated with the inorganic semiconductor layer, and a gate junction structure operatively associated with the gate electrode. The gate junction structure is positioned between the gate electrode and the inorganic semiconductor layer and includes an organic semiconductor layer for suppressing the injection of charge carriers having a first charge type from the gate electrode into the inorganic semiconductor layer. The charge carriers having the first charge type correspond to majority carriers in the inorganic semiconductor layer. The method further includes causing the junction field-effect transistor to provide electrical current to an electronic device.

An exemplary structure includes an array of junction field-effect transistors, each of the junction field-effect transistors including a doped inorganic semiconductor layer, a gate electrode, first and second ohmic contacts operatively associated with the inorganic semiconductor layer, and a gate junction structure operatively associated with the gate electrode. The gate junction structure is positioned between the gate electrode and the inorganic semiconductor layer and includes an organic semiconductor layer for suppressing the injection of the charge carriers having a first charge type from the gate electrode into the inorganic semiconductor layer. The charge carriers having the first charge type correspond to majority carriers in the inorganic semiconductor layer. The structure further includes an array of thin film switching transistors, each of the thin film switching transistors being electrically connected to one of the junction field-effect transistors. An array of electronic devices is included in the exemplary structure, each of the electronic devices being electrically connected to one of the junction field-effect transistors.

A further exemplary method includes obtaining a substrate including a first inorganic semiconductor layer, a handle substrate, and an electrically insulating layer between the first inorganic semiconductor layer and the handle substrate. A doped, second inorganic semiconductor layer is formed from a region of the handle substrate adjoining the electrically insulating layer. An array of transistors is formed using the first inorganic semiconductor layer. The method further includes forming a plurality of via conductors through the electrically insulating layer, at least some of the via conductors being electrically connected to the transistors, forming a protective layer over the transistors, attaching a support substrate to the protective layer, forming a plurality of discrete active areas from the doped, second inorganic semiconductor layer, and forming an array of junction field-effect transistors using the discrete active areas. Each junction field-effect transistor includes a gate junction structure directly contacting one of the active areas, a gate electrode on the gate junction structure, and ohmic contacts. Each gate junction structure includes an organic semiconductor layer for suppressing the injection of the charge carriers having a first charge type from the gate electrode into the inorganic semiconductor layer. The charge carriers having the first charge type correspond to majority carriers in the doped, second inorganic semiconductor layer. The method further includes forming a second protective layer over the junction field-effect transistors and forming a plurality of electrical conductors within the second protective layer electrically connecting the junction field-effect transistors to the via conductors electrically connected to the first array of transistors.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Substantial beneficial technical effects are provided by the exemplary structures and methods disclosed herein. For example, one or more embodiments may provide one or more of the following advantages:

Enabling higher resolution displays due to relatively high drive current and/or low operation voltage compared to a-Si:H or organic TFTs;
Same fabrication infrastructure for backplane and frontplane structures feasible;
Low-temperature processing compatible with flexible and low-cost substrates;
Larger minimum device feature size (channel length) compared to a-Si:H devices allowing lower lithography costs.

Lower power consumption compared to a-Si:H or organic TFT backplanes due to lower operation voltages.

These and other features and advantages of the disclosed methods and structures will become apparent from the following detailed description of illustrative embodiments thereof, which is to be read in connection with the accompanying drawings.

BRIEF DESCRIPTION OF THE DRAWINGS

FIG. 2 shows a schematic illustration of a first exemplary junction field-effect transistor;

FIG. 3 shows a schematic illustration of a second exemplary junction field-effect transistor;

FIG. 4 shows a schematic illustration of an exemplary test junction field-effect transistor;

DETAILED DESCRIPTION

Figure 1:
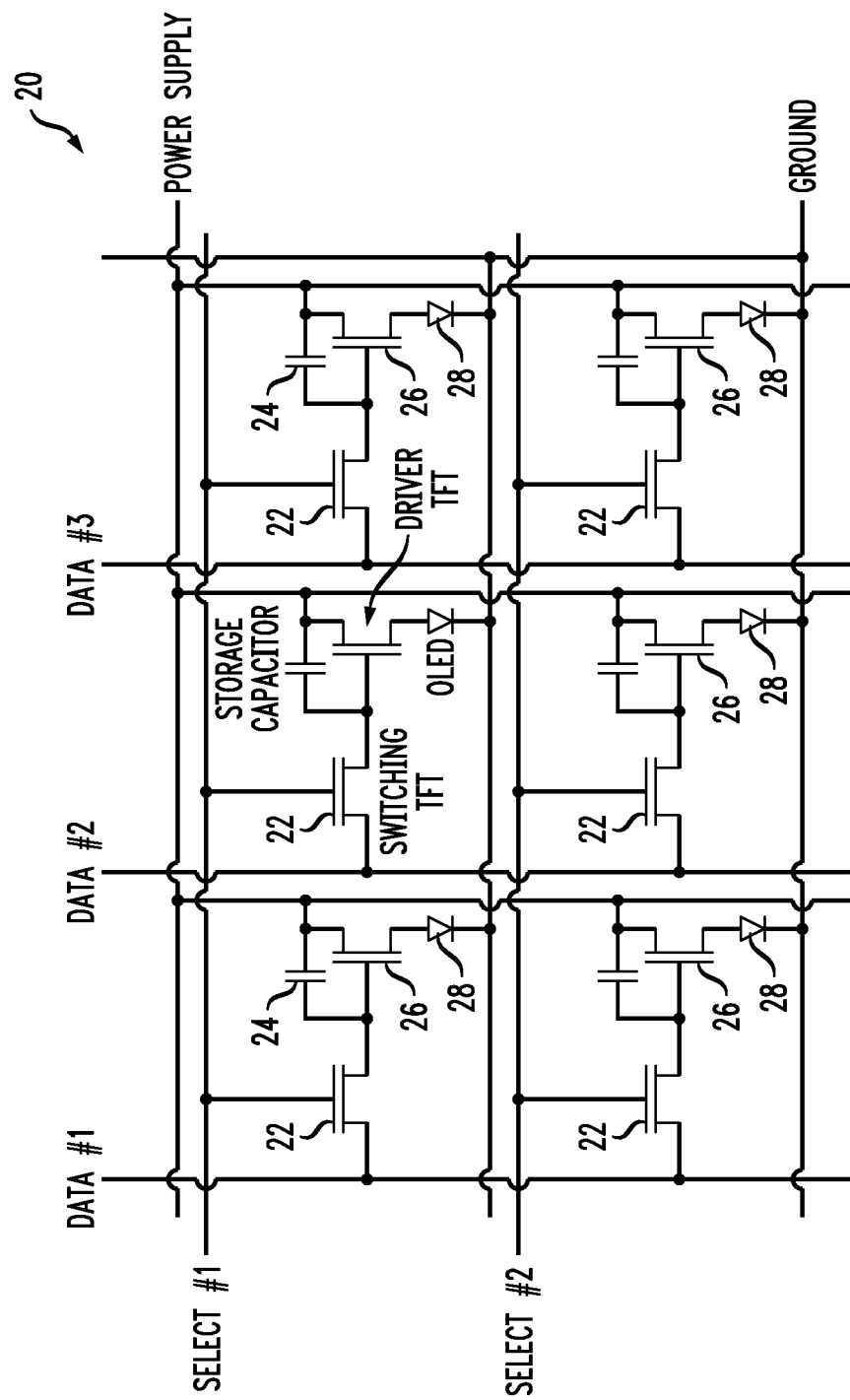
FIG. 1 shows a schematic illustration of active matrix pixel circuits in a TFT/OLED display.

Thin-film hybrid junction field-effect transistors (JFETs) are disclosed that include crystalline, inorganic channels and organic gate junctions. Such transistors are used in some embodiments for forming high resolution active matrix displays. A backplane refers to an array of transistors (active devices) used for addressing and programming passive devices such as light emitting diodes, liquid crystal displays, photosensitive materials (e.g. for x-ray imaging), or sensors (e.g. piezoelectric materials for sensing pressure). The backplane also contains address lines, program lines, power supply lines, and typically storage capacitors which are fabricated using the same process technology as that of the transistors. Arrays of passive devices addressed/programmed by the backplane are typically referred to as the frontplane. An active matrix refers to the combination of a backplane and a frontplane. Schematic pixel circuits of active-matrix arrays comprised of OLEDs are illustrated in FIG. 1. An exemplary OLED includes one or more layer(s) of organic electroluminescent material(s) disposed between two electrodes. The circuit 20 illustrated in FIG. 1 is a 3×2 active matrix, i.e. comprised of six (6) pixels. A switching thin film transistor (TFT) 22, a storage capacitor 24, and a driver thin film transistor 26 are operatively associated with an OLED 28. One TFT 22 is employed to start and stop charging of a storage capacitor while the other 26 functions as a current source to provide a constant current for each pixel. The storage capacitor maintains a constant voltage on a charged pixel between refresh cycles. The frontplane of passive elements (OLEDs) is integrated, e.g. laminated, onto a backplane including an array of TFT elements to control current flowing to the passive elements. The select and data lines respectively transfer the switching and programming/readout signals. As discussed below, hybrid driver thin film transistors having crystalline channels and organic gate junctions are disclosed that provide a high and stable drive current for passive devices such as OLEDs, thus allowing high resolution and low power consumption.

High resolution active matrix structures are fabricated using techniques described below. A backplane layer including active semiconductor devices is formed in some embodiments using a semiconductor-on-insulator substrate. The semiconductor-on-insulator substrate may be prepared by various layer transfer techniques known in the art such as controlled spalling, epitaxial layer lift-off or SMART CUT®. In these techniques, a thin layer of crystalline semiconductor is transferred from a host substrate and bonded onto an insulating handle (carrier) substrate. The transfer and/or bonding methods are different in different techniques. Driver transistors as disclosed herein are formed using the semiconductor layer of the substrate along with additional circuit elements that provide other functions such as computing or sensing. In other embodiments, the starting substrate is fabricated by crystallization of non-crystalline materials grown on an insulating substrate using known techniques such as laser crystallization. Substantially higher drive currents and/or lower operation voltages may be obtained compared to a-Si:H or organic TFTs due to the higher mobility of crystalline channels in the driver transistors. As used herein, the term "crystalline" refers to single-crystalline (mono-crystalline), or poly-crystalline (multi-crystalline); the term "non-crystalline" refers to amorphous, nano-crystalline and micro-crystalline. Although the use of crystalline channel materials provide substantial functional advantages over prior art structures, it will be appreciated by those skilled in the art that the principles of this disclosure are also applicable to non-crystalline channel materials.

FIG. 2 shows an exemplary schematic junction field-effect transistor 30 formed using a doped crystalline silicon substrate layer 32. The substrate is n-type in this exemplary embodiment. As used herein, "n-type" refers to the addition of impurities that contribute free electrons to an intrinsic semiconductor. In a silicon containing substrate, examples of n-type dopants, i.e. impurities, include but are not limited to antimony, arsenic and phosphorous. The doped semiconductor layer 32 can be formed as a continuous layer as shown during fabrication of a semiconductor-on-insulator (SOI) wafer. Ion implantation can alternatively be employed following SOI substrate wafer fabrication to form the doped layer. The layer 32 is between 20 nm-1 µm in thickness in one or more embodiments. The doping concentration of the layer 32 is between $10^{15}$ to $10^{19}$ $cm^{-3}$ in one or more embodiments. The transistor 30 includes ohmic contacts 33 and a gate stack 34. The gate stack 34 includes a gate electrode 35, an electron blocking layer 36, a hole blocking layer 38, and a passivation layer 39. The gate electrode 35 is preferably formed from a high workfunction material such as gold, platinum, palladium or nickel. The electron blocking layer 36 is a layer of organic semiconductor material. The gate junction (i.e. the junction between gate stack 34 and n-type substrate 32) is analogous to a conventional p-n junction, with the gate stack being analogous to the p-side of the p-n the junction. As such, the overall operation of the junction field-effect transistor (JFET) 30 is analogous to that of a conventional JFET wherein the gate junction is comprised of a p-n junction (i.e. the gate stack is comprised of a p-type material). In a conventional JFET, the gate junction is operated under negative bias (or a small positive bias lower than the turn-on voltage of the gate p-n junction) to avoid forward-biasing the gate junction. This is because forward-biasing the gate junction results in the flow of a large electrical current through the gate junction and as a result the JFET loses the useful properties of a transistor. (Note by virtue of Kirchhoff's current law, the algebraic sum of the currents flowing through the gate, source and drain electrodes is zero. Therefore, a current flow through the gate results in the drain and source currents not being equal, with the difference between the source and drain currents flowing through the gate. As a result, at large positive gate voltages where the gate junction is substantially forward-biased, a large portion of the transistor current flows between the gate and the source rather than between the source and the drain). However, when the gate bias is reverse-biased, the current flowing through the gate junction is small and therefore the gate voltage can modulate the transistor current (flowing between source and drain) without resulting in undesired current through the gate. As the reverse bias on the gate junction is increased, the width of depletion region in the n-type substrate underneath the gate junction is increased and therefore the current flow between the drain and source is decreased. Similarly, in the disclosed JFET device 30, the gain junction should be reverse-biased (or only slightly forward-biased) to assure small current through the gate for proper device operation. A reverse-biased junction condition can be achieved by applying a negative bias on the gate, i.e. applying a lower voltage on the gate electrode compared to that on the source. (This means if the source is grounded, i.e.

at zero voltage, a negative voltage is applied to the gate). To ensure a low gate current at negative bias, the electron blocking layer must substantially suppress the injection of electrons from the gate electrode 35 into the substrate 32. This electron blocking function is achieved by the low electron affinity of the electron blocking layer 36 and/or the large electron effective mass in the electron blocking layer 36. As such, the electron blocking layer 36 is essential for device operation. Additionally, a hole blocking layer 38 may be optionally employed to suppress the injection of minority holes existing in n-type substrate 32 towards the gate electrode 35. (A portion of the minority holes in the n-type substrate 32 than can diffuse towards the surface of the substrate 32 before recombining with the majority electrons are drifted towards the gate electrode 35 and therefore contribute to the gate current. Effectively, this includes the minority holes existing within a hole diffusion length from the surface of the substrate 32). Moreover, a passivation layer 39 may be optionally employed to further reduce the gate current by saturating the dangling bonds at the surface of the substrate 32 and therefore reduce the thermal generation of electron-hole pairs at the surface of the substrate 32. (Thermally generated electrons drift towards the substrate 32 and the thermally generated holes drift towards the gate electrode 35, thus contributing to the gate current). The electron blocking layer 36 is a layer of organic semiconductor material. The hole blocking layer 38 and passivation layer 39, if employed, are preferably organic. One should note that if the gate junction of the JFET device 30 is forward biased (i.e. a positive voltage is applied to the gate with respect to the source), the electron blocking layer 36 may function as a hole transport layer (thus facilitating hole diffusion from electrode 35 towards the substrate 32) and the hole blocking layer 38, if present, may function as an electron transport layer (thus facilitating electron diffusion from the substrate 32 towards the gate electrode 35). A hole transport layer has a large hole affinity and/or a small effective mass for holes while an electron transport layer has a large electron affinity and/or a small effective mass for electrons. A majority of existing hole transport materials have electron blocking properties and a majority of existing electron transport materials have hole blocking properties. However, similar to a p-n junction in a conventional JFET, forward biasing the gate junction of the disclosed JFET device 30 results in large current flow through the gate junction and should be avoided to ensure proper device operation. Under reverse bias conditions (i.e. negative voltage on the gate with respect to source), layer 36 primarily functions as an electron blocking layer while layer 38, if present, primarily functions as a hole blocking layer. It should be noted that, similar to a conventional JFET, the device 30 may also function properly at small (near-zero) positive gate voltages (with respect to the source) where the gate junction is slightly forward biased and the therefore the gate current is sufficiently small that it can be tolerated. At near-zero gate bias, both the hole transport function (dominant function at positive bias) and the electron blocking function (dominant function at negative) may be conducted by layer 36 at close levels to each other. Similarly both the electron transport function (dominant function at positive bias) and the hole blocking function (dominant function at negative) may be conducted by layer 38 at close levels. As known in the art, organic materials may be evaporated at or close to room-temperature or grown from a solution thus allowing lower growth costs compared to typical inorganic materials which require more complex growth techniques or more expensive precursors. In some embodiments, some or all of the electron blocking (or hole transport), hole blocking (or electron transport) and passivation functions are served by a single layer. Examples of organic materials which can provide electron blocking (or hole transport) functions include but are not limited to pentacene, rubrene, anthracene, poly(3-hexylthiophene) (P3HT); tetraceno[2,3-b]thiophene; α-sexithiophene; poly(3,3'''-didodecylquaterthiophene); poly(2,5-bis(3-decylthiophen-2-yl)thieno[3,2-b]thiophene); N,N'-Bis(3-methylphenyl)-N,N'-diphenyl-benzidine (TPD); 1N,N'-Bis(phenanthren-9-yl)-N,N'-bis(phenyl)-benzidine (PAPB); 4,4'-Bis(N-carbazolyl)-1,1'-biphenyl (CBP); 1,3-Bis(N-carbazolyl)benzene (mCp); 4,4'-Cyclohexylidenebis[N,N-bis(4-methylphenyl)benzenamine] (TAPC); 2,2'-Dimethyl-N,N'-di-[(1-naphthyl)-N,N'-diphenyl]-1,1'-biphenyl-4,4'-diamine (α-NPD); 9,9-Dimethyl-N,N'-di(1-naphthyl)-N,N'-diphenyl-9H-fluorene-2,7-diamine (NPB); N,N'-Di-[(1-naphthyl)-N,N'-diphenyl]-1,1'-biphenyl)-4,4'-diamine (NPD); N,N'-Di(2-naphthyl-N,N'-diphenyl)-1,1'-biphenyl-4,4'-diamine (β-NPB); Tri-p-tolylamine; 4,4',4''-Tris[phenyl(m-tolyl)amino]triphenylamine; Tris(4-carbazoyl-9-ylphenyl)amine (TCTA); Tetra-N-phenylbenzidine (TPB); 1,3-Bis(triphenylsilyl)benzene; poly-aniline; poly(3,4-ethylenedioxythiophene); poly(3,4-ethylenedioxythiophene)-poly(styrenesulfonate) (PEDOT:PSS); poly(3,4-ethylenedioxythiophene); tetracyanoethylene; poly(thiophene-3-[2-(2-methoxyethoxy) ethoxy]-2,5-diyl); bis-poly(ethyleneglycol) (PEDOT:PEG); 7,7,8,8-Tetracyanoquinodimethane, and combinations thereof. In preferred embodiments, all the blocking and passivation layers are comprised of organic materials in order to take full advantage of the benefits of organic materials, including low cost and low-temperature processing capability.

In some embodiments, the semiconductor layer 32 is a pure monocrystalline silicon layer doped with an n-type dopant. In other embodiments, the substrate is comprised of other group IV materials such as Ge, SiGe, SiC, SiGeC or GeC. In other embodiments, the substrate is comprised of III-V or II-VI compound semiconductors. The semiconductor layer directly contacts an electrically insulating layer 31. In one or more embodiments, the electrically insulating layer 31 is a buried oxide (BOX) layer. The insulating layer 31 in an exemplary embodiment is between 5-200 nm, but may also be thicker or thinner for some applications. The electrically insulating layer 31 in one exemplary embodiment is comprised of silicon dioxide, though other buried insulators such as boron nitride (BN) and aluminum oxide ($Al_2O_3$) may alternatively be employed in some embodiments. High quality buried oxides are generally characterized by relatively low interface trap densities ($D_{it}$). However, it should be noted that since carrier transport (from source to drain) in the disclosed junction field-effect transistor 30 takes place by majority carriers (electrons), and the minority carriers (holes) are not involved, the device operation is not sensitive to the quality of the buried oxide as characterized by a low Dit. Therefore, a high quality buried oxide is not required. In some embodiments, the insulating layer 31 is comprised of glass or clear plastic.

FIG. 3 shows an exemplary schematic junction field-effect transistor 70 formed using a doped crystalline silicon substrate layer 72 on an electrically insulating substrate layer 31. The silicon substrate layer 72 is p-type in this exemplary embodiment. The doped semiconductor layer 72 can be formed as a continuous layer as shown during fabrication of a semiconductor-on-insulator (SOI) wafer. Ion implantation can alternatively be employed following SOI substrate wafer fabrication to form the doped layer. The layer 72 is between 20 nm-1 µm in thickness in one or more embodiments. The doping concentration of the layer 32 is between $10^{15}$ to $10^{19}$ cm$^{-3}$ in one or more embodiments. In a silicon-containing substrate, examples of p-type dopants include but are not limited to boron, aluminum, gallium and indium. The transistor 70 includes ohmic contacts 73 and a gate stack 74. The gate stack 74 includes a gate electrode 75, a hole blocking layer 76, an electron blocking layer 78, and a passivation layer 79. The gate electrode 75 is preferably formed from a low workfunction material such as magnesium or erbium. The hole blocking layer 78 is a layer of organic semiconductor material. The electron blocking layer 76 and passivation layer 79, if employed, are preferably organic. In some embodiments, some or all of the electron blocking, hole blocking and passivation functions are served by a single layer. The operation of the device 70 is the same as that of device 30 with the opposite carrier types involved. As explained for device 30, the hole blocking layer and electron blocking layer may perform electron transport and hole transport functions, respectively, under forward bias or near-zero gate bias conditions. Examples of organic materials which can provide hole blocking (or electron transport) functions include but are not limited to bathocuproine (BCP); bathophenanthroline (BPhen); 3-(Biphenyl-4-yl)-5-(4-tert-butylphenyl)-4-phenyl-4H-1,2,4-triazole (TAZ); 2-(4-Biphenylyl)-5-phenyl-1,3,4-oxadiazole (PBD); bis(8-hydroxy-2-methylquinoline)-(4-phenylphenoxy)aluminum; 2,5-Bis(1-naphthyl)-1,3,4-oxadiazole (BND); 2-(4-tert-Butylphenyl)-5-(4-biphenylyl)-1,3,4-oxadiazole (Butyl-PBD); Tris-(8-hydroxyquinoline) aluminum (Alq3); hexadecafluoro copper phthalocyanine ($F_{16}$CuPc); naphthalene diimide derivatives; perylene diimide derivatives; $C_{60}$; and combinations thereof. Electron mobility is higher than hole mobility in silicon. Commercially available hole transport organic semiconductor materials such as pentacene have relatively high mobility and are more stable than many available organic electron transport materials. Transistors as shown in FIG. 2 accordingly have some present advantages with respect to transistors as shown in FIG. 3.

Figure 5:
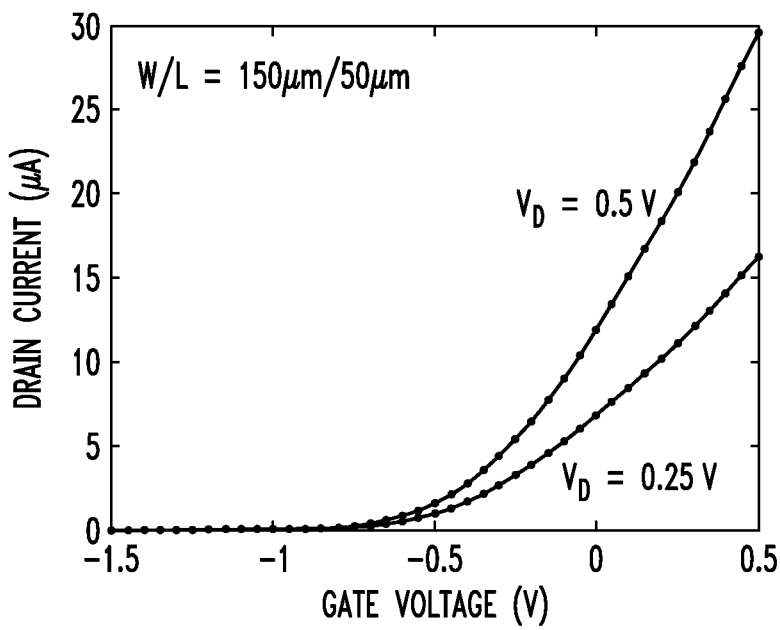
FIG. 5 is a graph showing drain current of the test transistor of FIG. 4 as a function of gate voltage.
Figure 6:
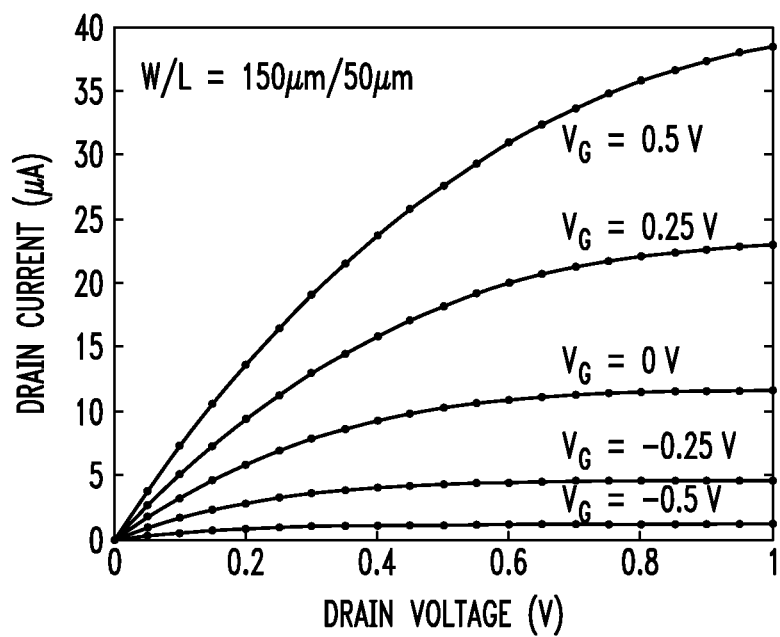
FIG. 6 is a graph showing drain current of the test transistor of FIG. 4 as a function of drain voltage.

A simplified test device 100 is schematically illustrated in FIG. 4. The test device is formed using a semiconductor-on-insulator substrate including an n-type monocrystalline silicon layer 102 on a buried oxide (BOX) layer 104. The layer 102 has a thickness of 32 nm and a doping level ($N_D$) of $5 \times 10^{17}$ cm$^{-3}$. A pentacene layer 108 is formed on the silicon layer 102 and a gate electrode 106 is formed on the pentacene layer 108. In this exemplary embodiment, the pentacene layer 158 has a thickness of approximately 50 nanometers (nm) and is formed by thermal evaporation at room temperature with an average evaporation rate of approximately 0.3 angstroms per second (Å/sec), using a solid (powder) evaporation source material having a purity of higher than 99%. (In other embodiments, the pentacene layer 158 may be alternatively formed using a solution containing a pentacene precursor such as 13,6-N-Sulfinylacetamidopentacene, and applied by spin-coating followed by curing. A solvent such as chloroform, chlorobenzene or combinations thereof may be used to prepare the solution. Curing may be performed at temperatures close to 200° C. in a dry atmosphere, although lower temperatures may be used as well.) The gate electrode 106 is comprised of gold and thermally evaporated at room temperature at an average evaporation rate of approximately four (4) angstroms per second (Å/sec). Drain and source electrodes 110, 112 (comprised of aluminum deposited by thermal evaporation) are formed on a heavily doped n$^+$ silicon layer 114 with $N_D$ of larger than $10^{20}$ cm$^{-3}$. Alternatively, a low workfunction metal such as erbium may be used as the drain and source electrodes 110 and 112 to form direct ohmic contacts to substrate 102 (i.e. n$^+$ Si layer 114 omitted). FIG. 5 shows drain current (µA) as a function of gate voltage (V) for two drain voltages $V_D$. FIG. 6 shows drain current as a function of drain voltage for six values of gate voltage ($V_G$). The test device 100, having a gate width/length (W/L) ratio of about three (3) provides a drive current of about 25 µA at gate-source and drain-source voltages ($V_{GS}$ and $V_{DS}$) of 0.5V. In contrast, an a-Si:H TFT provides a drive current of 2 µA where W/L is thirty, $V_{GS}$ is 5V and $V_{DS}$ is 15V. The test device 100 accordingly has a drive current that is substantially higher than the a-Si:H TFT as much lower voltages.

Figure 7:
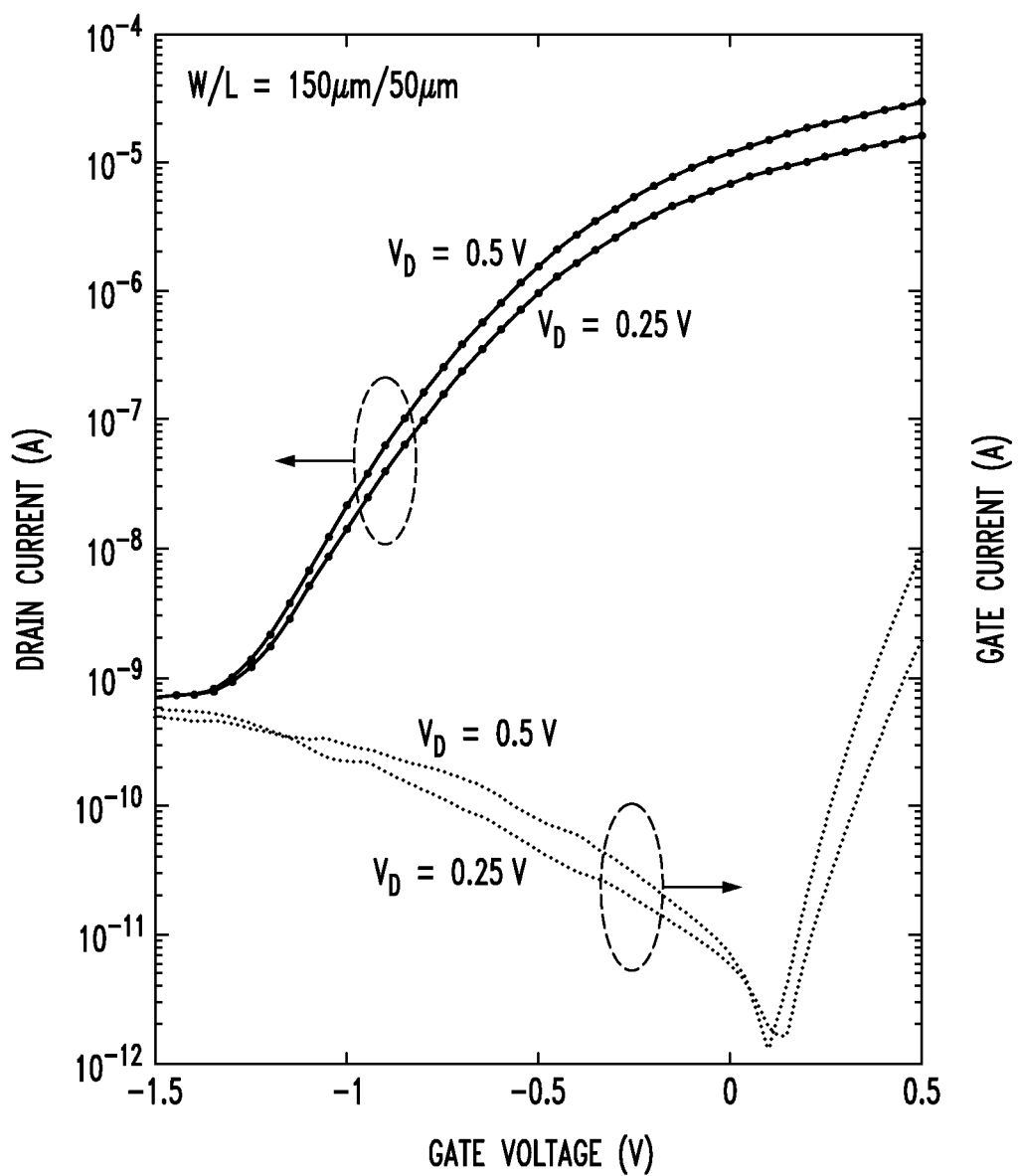
FIG. 7 is a graph showing drain and gate currents of the test transistor of FIG. 4 as a function of gate voltage.

FIG. 7 is a re-plot of the drain current as a function of the gate voltage for device 100 as shown in FIG. 5, with the drain current plotted in logarithmic scale. The absolute value of the gate current of the test device 100 is also plotted in FIG. 5 in a logarithmic scale. Both the drain current and the gate current are plotted for a gate W/L of 150 µm/50 µm and two different values of $V_D$. The relatively large off-current is due to gate leakage, i.e. reverse saturation current of the gate junction. Such leakage is due, in part, to the absence of surface passivation on the surface of the silicon layer 102. Gate leakage depends on the gate area W×L while drive current (i.e. source/drain current) depends on the W/L ratio. For example, if W/L=15 µm/5 µm, leakage should reduce to $10^{-11}$ A without affecting the ON current. Various materials may be employed for providing silicon surface passivation. Exemplary materials include aromatic organic materials such as PQ (9,10-phenanthrenequinone), P3HT (poly 3-hexylthiophene-2,5-diyl) and inorganic materials such as hydrogenated amorphous silicon. In some other embodiments, the passivation layer is comprised of an organic monolayer formed by immersing the substrate is a solution of a long-chain alcohol or thiol.

Figure 9:
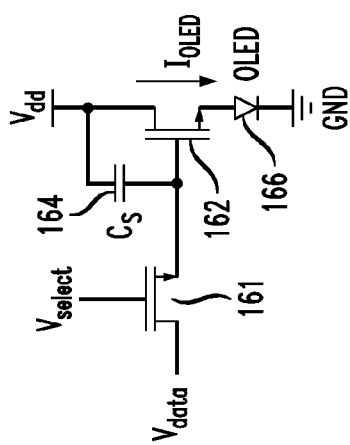
FIG. 9 is a circuit diagram corresponding to the pixel layout shown in FIG. 8.
Figure 8:
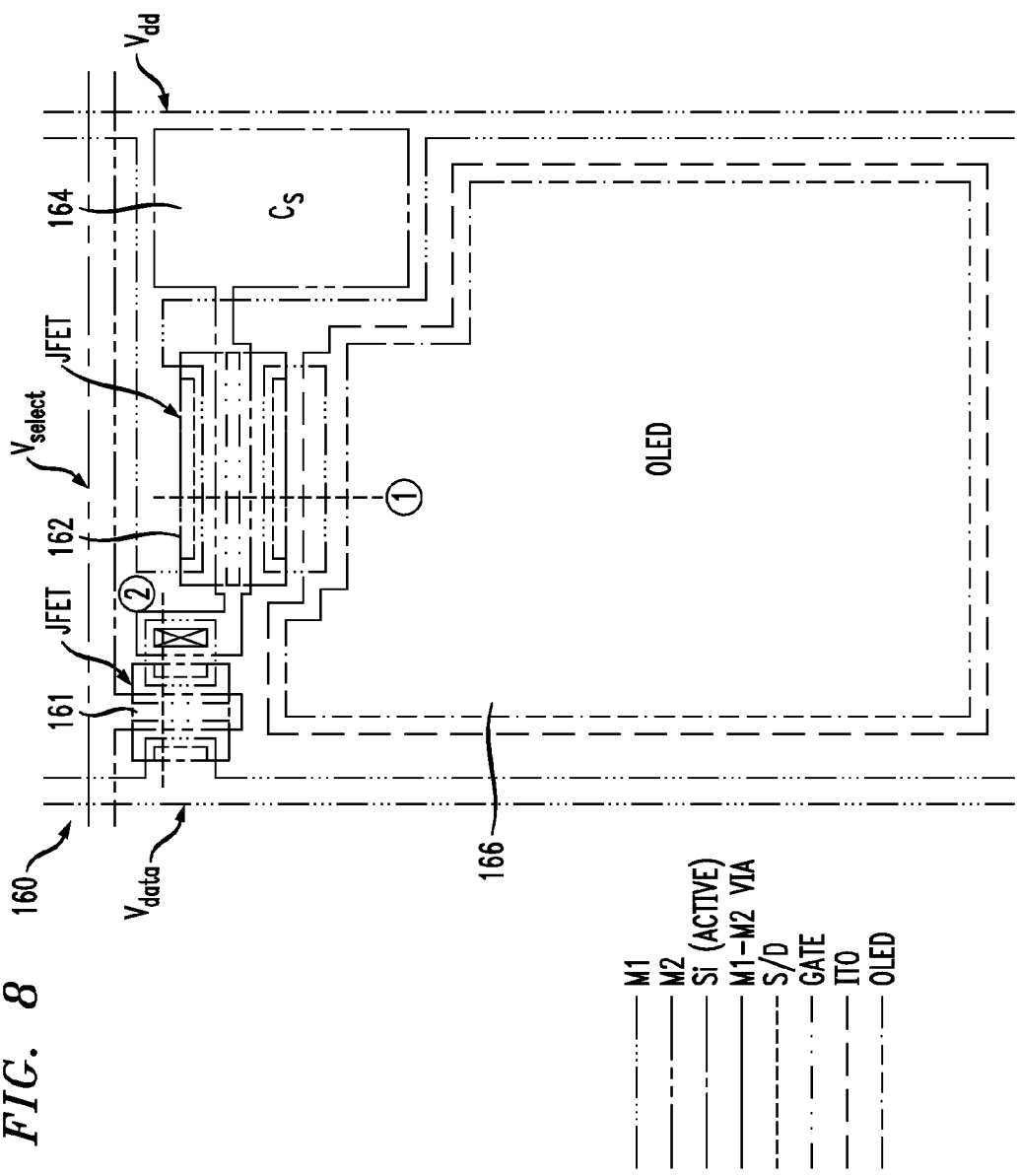
FIG. 8 is a schematic illustration of an exemplary pixel layout including junction field-effect transistors functioning as switching and drive transistors.
Figure 10A:
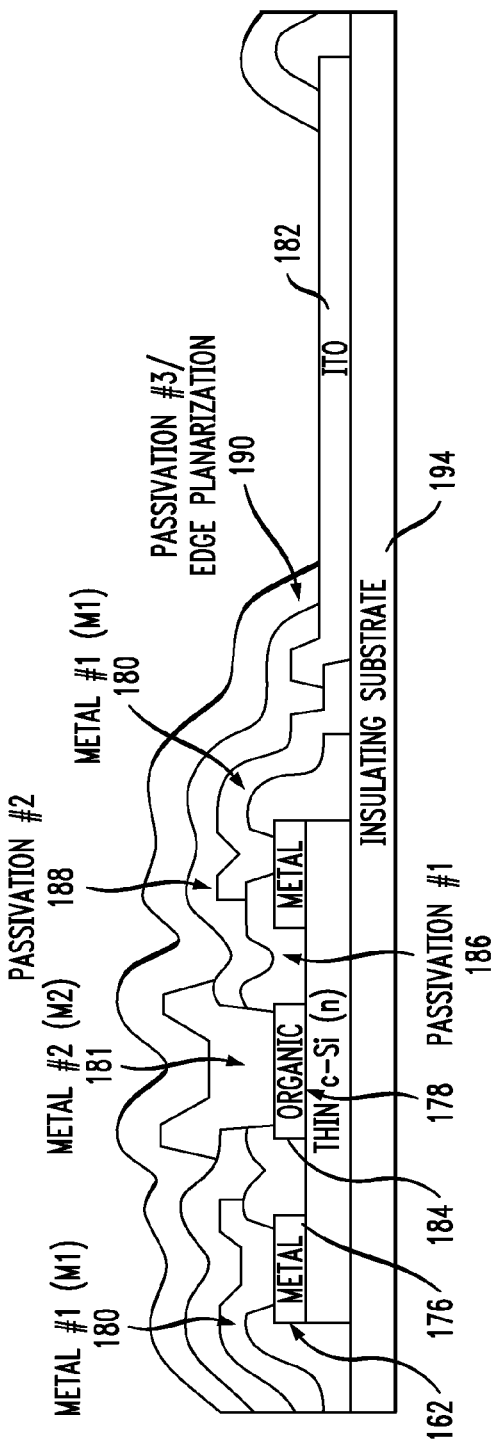
FIG. 10A is a schematic illustration of the portion of the pixel layout taken along line 1 of FIG. 8.
Figure 10B:
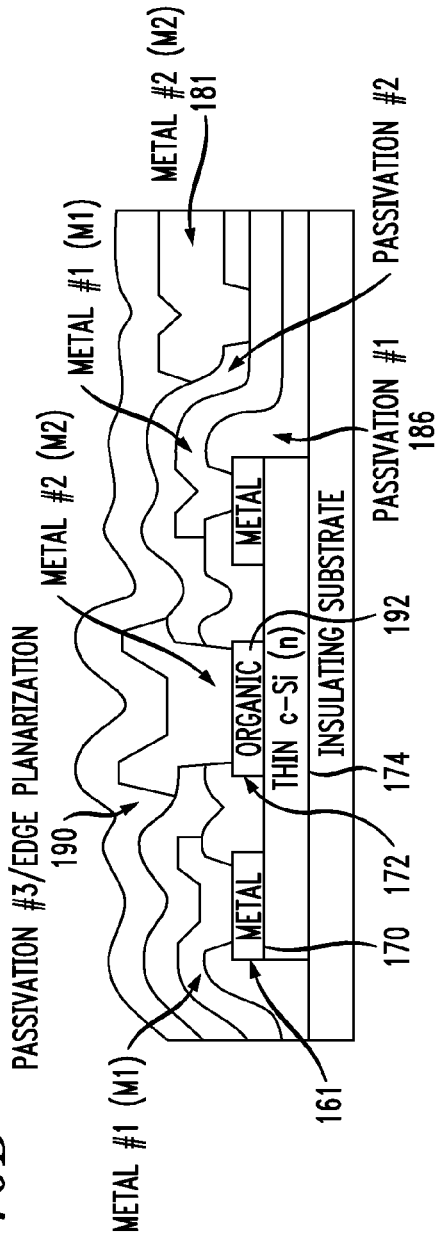
FIG. 10B is a schematic illustration of the portion of the pixel layout taken along line 2 of FIG. 8.

FIG. 8 provides a schematic illustration of a backplane structure 160 including JFETs 161, 162 that function as switching and driver transistors. The JFETs include structures such as shown in FIGS. 2 and/or 3 including crystalline inorganic channels and organic semiconductor gate junctions. The JFETs are electrically connected to a storage capacitor 164 and provide current to an OLED 166. FIG. 9 is a circuit diagram corresponding to the pixel layout of FIG. 8. FIGS. 10A and 10B provide schematic cross sectional views of the JFETs 161, 162 and associated elements shown in FIG. 8 prior to OLED deposition. The switching JFET 161 includes source/drain regions 170 and a gate structure 172 formed on a c-Si layer 174. The driver JFET 162 also includes source/drain regions 176 and a gate structure 178 formed on an active area of the c-Si layer 174. The driver transistor 162 is electrically connected by a first metal layer 180 to an indium tin oxide (ITO) conductor 182 that functions as an anode for the OLED 166. A second metal layer 181 is in electrical contact with an organic gate junction 184. First, second and third passivation layers 186, 188, 190 are provided. The first passivation layer 186 is formed on the surface of the c-Si layer. The switching JFET 161 in the exemplary backplane structure 160 also includes an organic junction 192 that forms part of the gate structure 172. The c-Si layer 174 adjoins an electrically insulating substrate 194.

Figure 11:
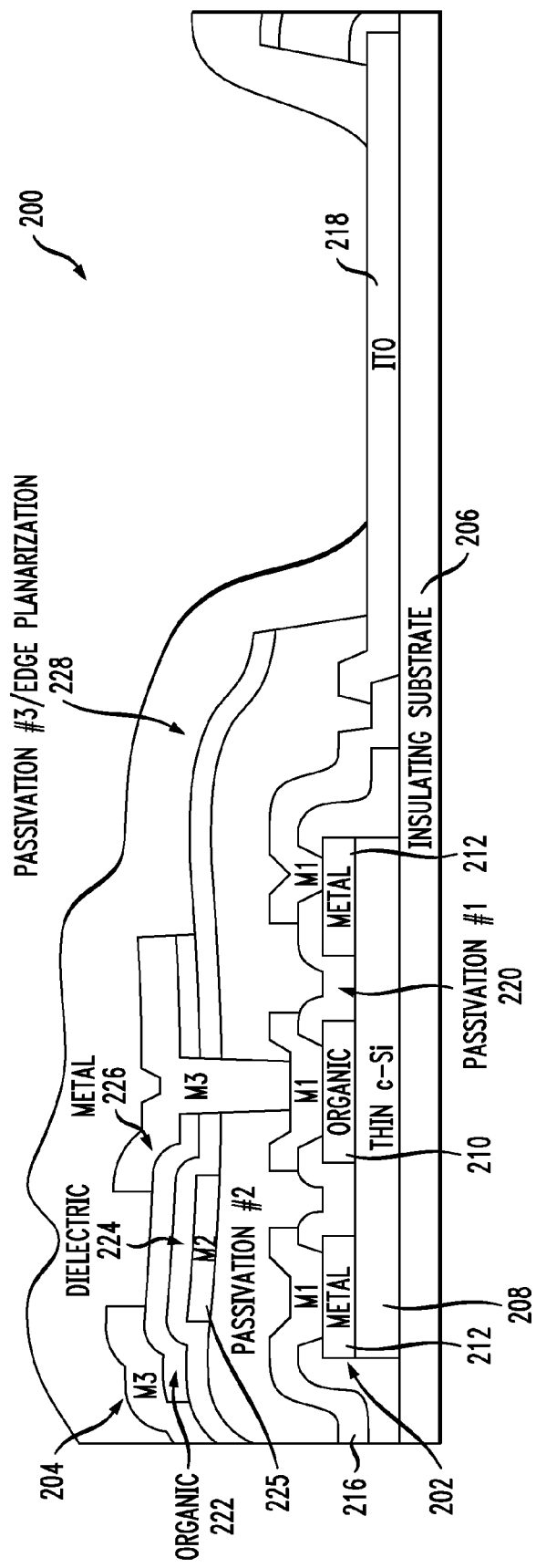
FIG. 11 is a schematic illustration of an exemplary backplane structure including an inverted-staggered bottom gate organic thin film transistor.

An exemplary vertically integrated backplane 200 including junction field-effect driver transistors 202 is schematically shown in FIG. 11. In this exemplary embodiment, an organic thin film transistor 204, which functions as a switch, is integrated on top of each junction field-effect transistor 202. The junction field-effect transistors 202 function as driver transistors for passive devices, such as the OLEDs shown in FIGS. 8 and 9. The active devices are formed on an insulating substrate 206. A thin, doped (e.g. n-type) crystalline silicon layer 208 adjoins the substrate 206. As discussed above with respect to FIGS. 2 and 3, the silicon layer 208 can be n-type or p-type. Organic gate junctions 210 are formed on the silicon layer 208. The organic gate junctions correspond to passivation, hole blocking, and electron blocking layers such as those described above with respect to FIG. 2 in some embodiments wherein the electron blocking layer is organic. The other layers of the gate junctions 210, which are optional, are also preferably organic. The metal layer 216 (M1) is electrically connected to the ohmic contacts 212 and the organic gate junctions of the driver transistors 202. Each junction field-effect transistor 202 is electrically connected to an indium tin oxide (ITO) electrode 218. A first passivation layer 220 is formed on the silicon layer 208. The organic thin film transistors 204 in this exemplary embodiment are inverted-staggered bottom-gate devices. They include channels comprised of organic layers 222 and dielectric layers 224 formed between the channel layers and a metal layer 225. The transistors 204 are electrically connected to the drive transistors 202 by a metal layer 226 (M3). The drain of each transistor 204 is electrically connected to the gate electrode of one of the hybrid bipolar junction transistors 202 in the exemplary embodiment as shown. The transistors 202, 204 are incorporated in a circuit as shown in FIG. 1 in some embodiments. A third passivation layer 228 is formed over thin film (switching) transistors 204. The passivation layers 220, 221 and 228 are comprised of insulating materials which may or may not be organic. Inorganic passivation layers are preferably grown by thermal evaporation, e-beam evaporation or atomic layer deposition to avoid the use of plasma which may damage organic materials; however the growth methods involving plasma such as PECVD or sputtering may be used in some embodiments. Examples of inorganic insulators include but are not limited to silicon dioxide, silicon nitride, aluminum oxide, hafnium oxide or combinations thereof. Organic passivation layers are typically grown by thermal evaporation or spun from a solution. Examples of organic insulating materials that can be employed for one or more of the passivation layers include but are not limited to parylene, polyimide, polystyrene and polyvinyl alcohol (PVA). In some embodiments, the organic insulating materials may include a photo-sensitizing material to facilitate the patterning of these materials using photolithography. In one example, ammonium dichromate is used as a photo-sensitizer in a PVA solution and applied by spin coating. In some embodiments the passivation layer 228 may also serve as an edge planarization layer to avoid shorts between the OLED cathode (not shown) and the OLED anode, layer 218 (e.g. ITO). In some embodiments edge planarization may be facilitated by a reflow process which involves low temperature annealing of a polymeric passivation layer after spincoating and patterning the polymeric passivation layer. Amorphous silicon is not required in the exemplary backplane. The fill factor of each pixel is improved by reducing the active device area, thus providing more area for the OLED (not shown) operatively associated with each switching and driver transistor. It will be appreciated that, in alternative embodiments of the backplane, the organic thin film transistors 204 may be incorporated on the side rather than on top of the electrically associated drive transistors 202.

Figure 12:
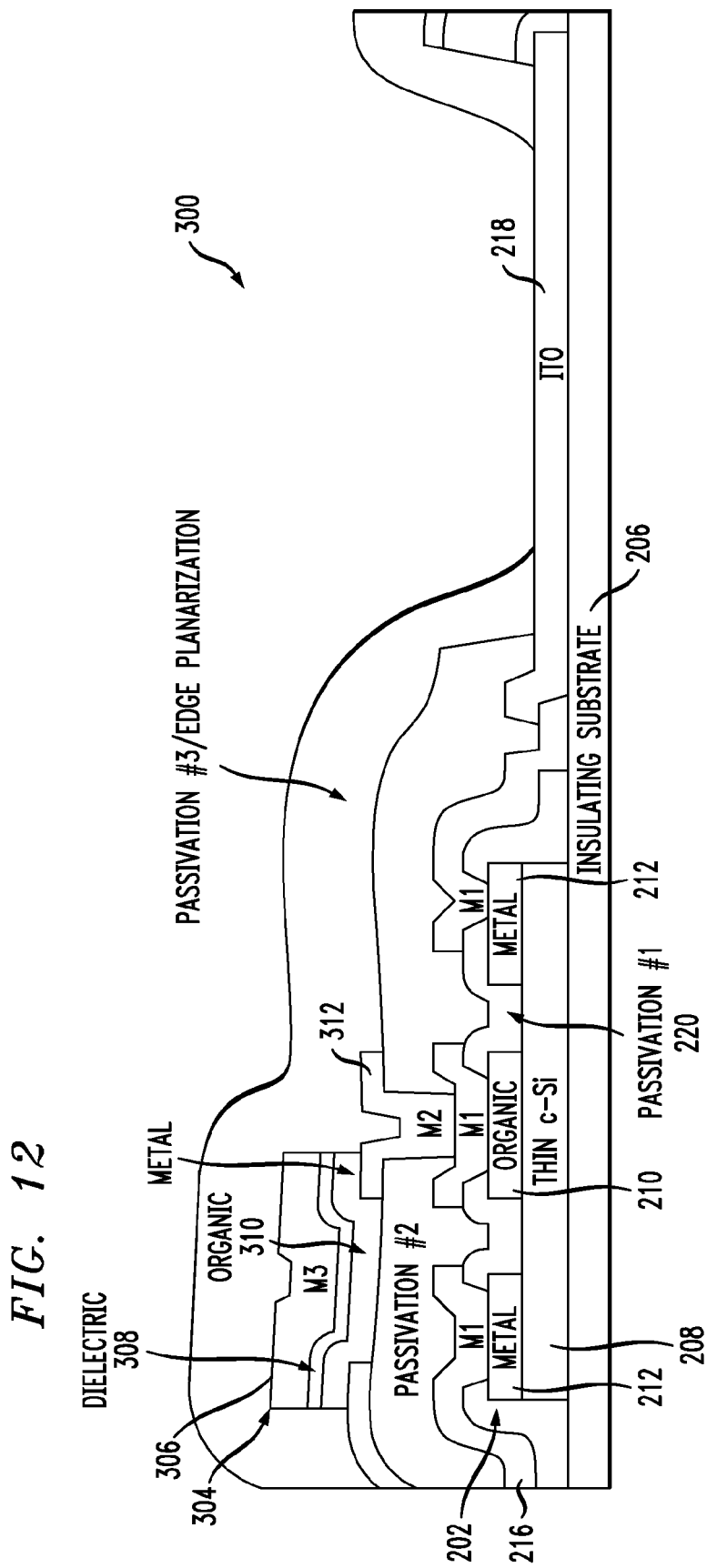
FIG. 12 is a schematic illustration of an exemplary backplane structure including a top-gate staggered bottom gate organic thin film transistor.
Figure 13:
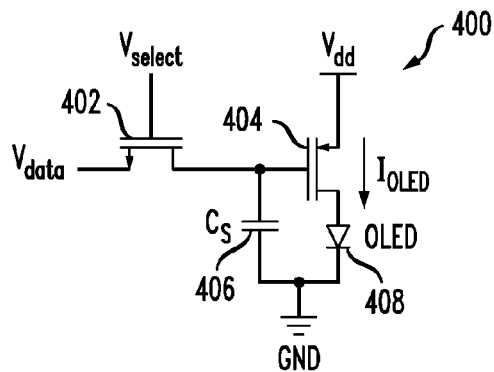
FIG. 13 is a circuit diagram showing a first exemplary pixel circuit.

A second exemplary vertically integrated backplane 300 is shown in FIG. 12. The backplane 300 includes elements that are also found in the backplane 200 discussed above and are designated with the same reference numerals. In this exemplary embodiment, a top-gate staggered organic thin film transistor 304 is electrically connected to a thin-film drive transistor 202. A metal layer 306 (M3) adjoins a gate dielectric layer 308. Materials such as silicon dioxide or high-k materials such as $HfO_2$ or $Al_2O_3$ can be employed as gate dielectric layers. Organic dielectric layers such as parylene and polyimide are used in some embodiments. An organic channel layer 310 adjoins the gate dielectric layer. Each thin film switching transistor 304 is electrically connected to the gate electrode of a drive transistor 202 by a second metal layer 312.

FIGS. 13-16 show exemplary pixel circuits including JFETs as described herein. It will be appreciated that other pixel circuits are familiar to those of skill in the art and that one or more of the exemplary JFETs may be incorporated in such pixel circuits or those developed in the future. The exemplary circuit 400 shown in FIG. 13 includes switch and driver thin film transistors 402, 404 wherein at least the driver transistor is a JFET having an organic semiconductor layer that provides at least one of electron and hole blocking, whichever is the majority carrier, and a storage capacitor 406. The driver TFT 404 is connected to an OLED anode, the OLED cathode being connected to ground. A power supply voltage $V_{dd}$ is applied to the driver TFT. Direct programming is possible using such a circuit. In this embodiment, $I_{OLED} \approx I_{DSS} \cdot [1-(V_{dd}-V_{data})/|V_P|]^2$ where $V_P$ and $I_{DSS}$ are the pinch-off voltage and drain-source saturation current for the JFET transistor 404. (Direct programming means the OLED current ($I_{OLED}$) can be set by the driver transistor (i.e. JFET 404) independent of the OLED voltage ($V_{OLED}$). This is the case in this exemplary embodiment, as $V_{OLED}$ is not present in the above equation). The circuit may be employed, for example, in conjunction with a standard bottom-emission OLED 408.

Figure 14:
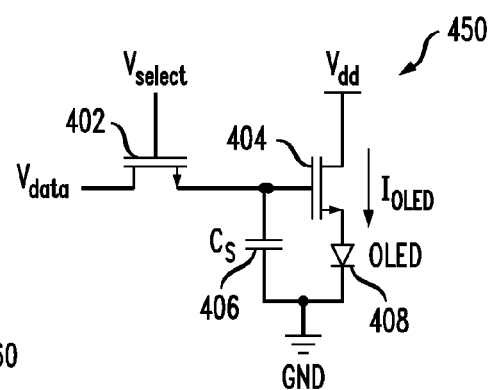
FIG. 14 is a circuit diagram showing a second exemplary pixel circuit.

FIG. 14 shows a further exemplary pixel circuit 450 including a driver TFT 404 connected to an OLED anode. While a bottom-emission OLED 408 can be employed within the circuit, direct programming is not possible. In this embodiment, $I_{OLED} \approx I_{DSS} \cdot [1-(V_{data}-V_{OLED})/|V_P|]^2$ where $V_P$ and $I_{DSS}$ are the threshold voltage and drain-source saturation current for the JFET 404, respectively.

Figure 15:
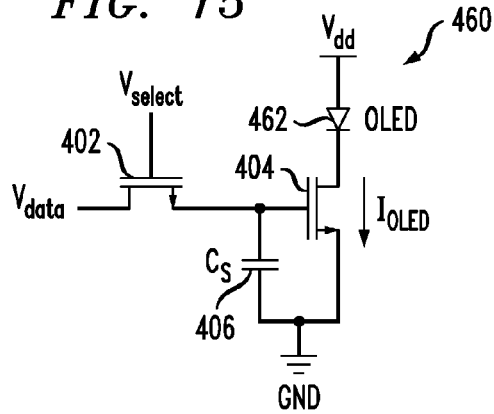
FIG. 15 is a circuit diagram showing a third exemplary pixel circuit.

FIG. 15 shows a further exemplary pixel circuit 460 including a driver TFT 404 connected to an OLED cathode. Direct programming is possible using such a circuit 460, but a top emission OLED 462 is required. In this embodiment, $I_{OLED} \approx I_{DSS} \cdot (1-V_{data}/|V_P|)^2$. $V_P$ and $I_{DSS}$ are the threshold voltage and drain-source saturation current for the JFET 404, respectively.

Figure 16:
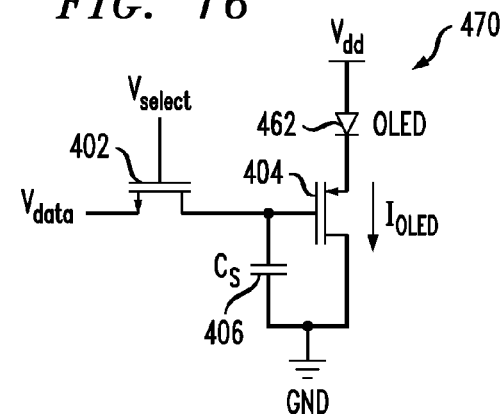
FIG. 16 is a circuit diagram showing a fourth exemplary pixel circuit.

FIG. 16 shows a further exemplary pixel circuit 470 including a driver TFT 404 connected to an OLED cathode. Direct programming is not possible using such a circuit 470 and a top emission OLED 462 is required. $I_{OLED} \approx I_{DSS} \cdot [1-(V_{dd}-V_{data}-V_{OLED})/|V_P|]^2$ in this exemplary circuit.

Figure 17:
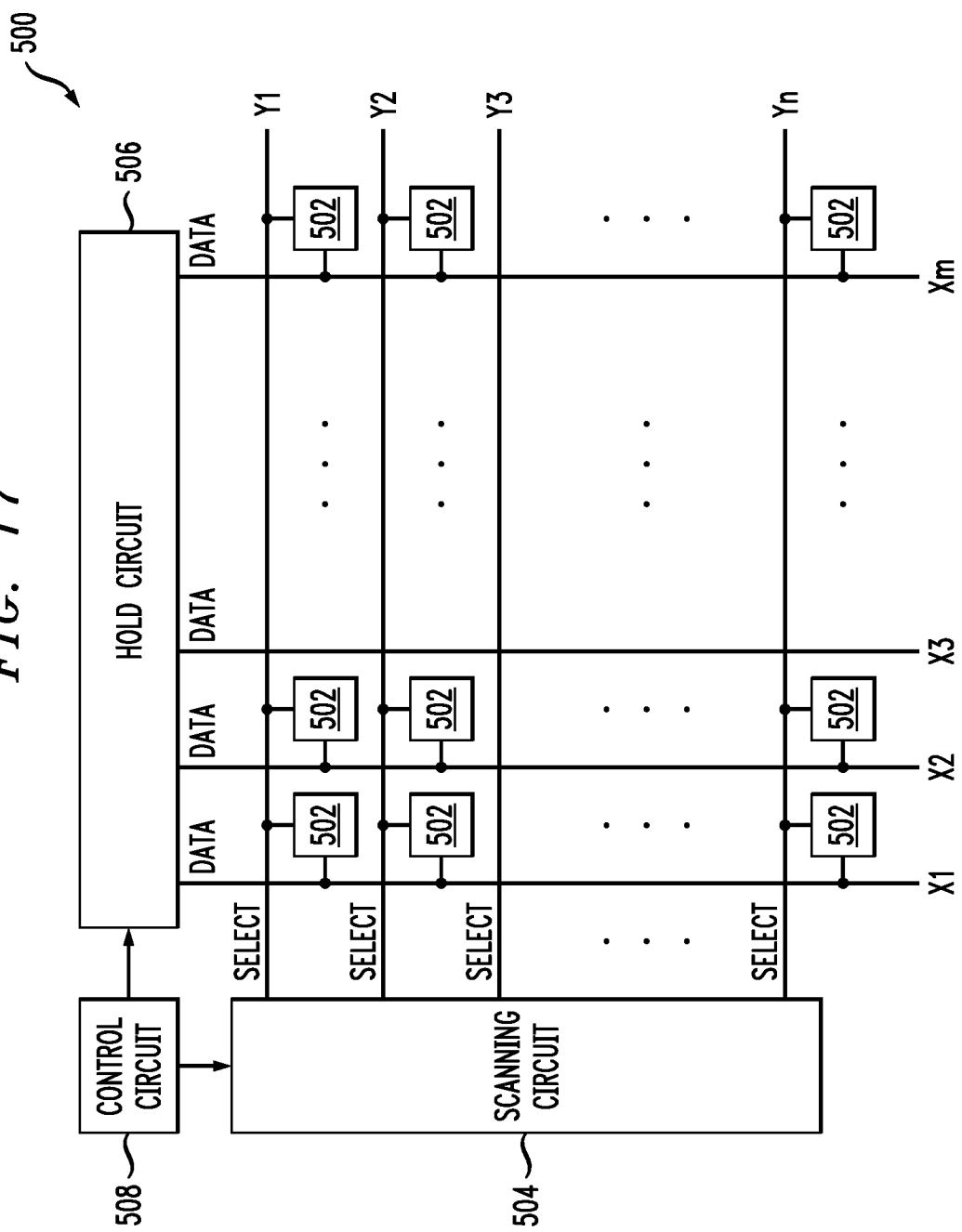
FIG. 17 is a schematic illustration of an exemplary active matrix display.

FIG. 17 shows a schematic illustration of an exemplary active matrix display 500 having pixel circuits 502 including JFET drive transistors having organic gate junctions as described above. The display includes a scanning circuit 504, a hold circuit 506 and a control circuit 508 operatively associated with the scanning and hold circuits. During a scan period, scan signals ("select") are generated that cause switching transistor(s) to be turned on. The data signals cause the charging of the storage capacitors within the pixel circuits that have received the scan signals. The switching transistors are turned off by scan signals at the end of the scan period, cutting off the data signals. The storage capacitors provide electrical current to the JFET drive transistors until the next scan period. In accordance with one or more exemplary embodiments, the scanning circuit, hold circuit and control circuit of the active matrix display 500 are fabricated using CMOS technology familiar to those of skill in the art. The pixel circuits incorporated within the backplane of the active matrix display are fabricated using a doped, crystalline inorganic semiconductor layer such as a c-Si layer to form channel layers and organic material(s) to form gate junctions of at least the driver transistors within the pixel circuits. In some embodiments, both the switching and driver transistors are formed as hybrid JFETs having inorganic channels and organic gate junctions. In other embodiments, the driver transistors are formed as hybrid JFETs while the switching transistors are formed as organic TFTs. In some exemplary embodiments, the same infrastructure used for OLED growth is used for the growth of the organic gate junctions within the pixel circuits, eliminating the need for infrastructure required for a-Si:H deposition.

Figure 18:
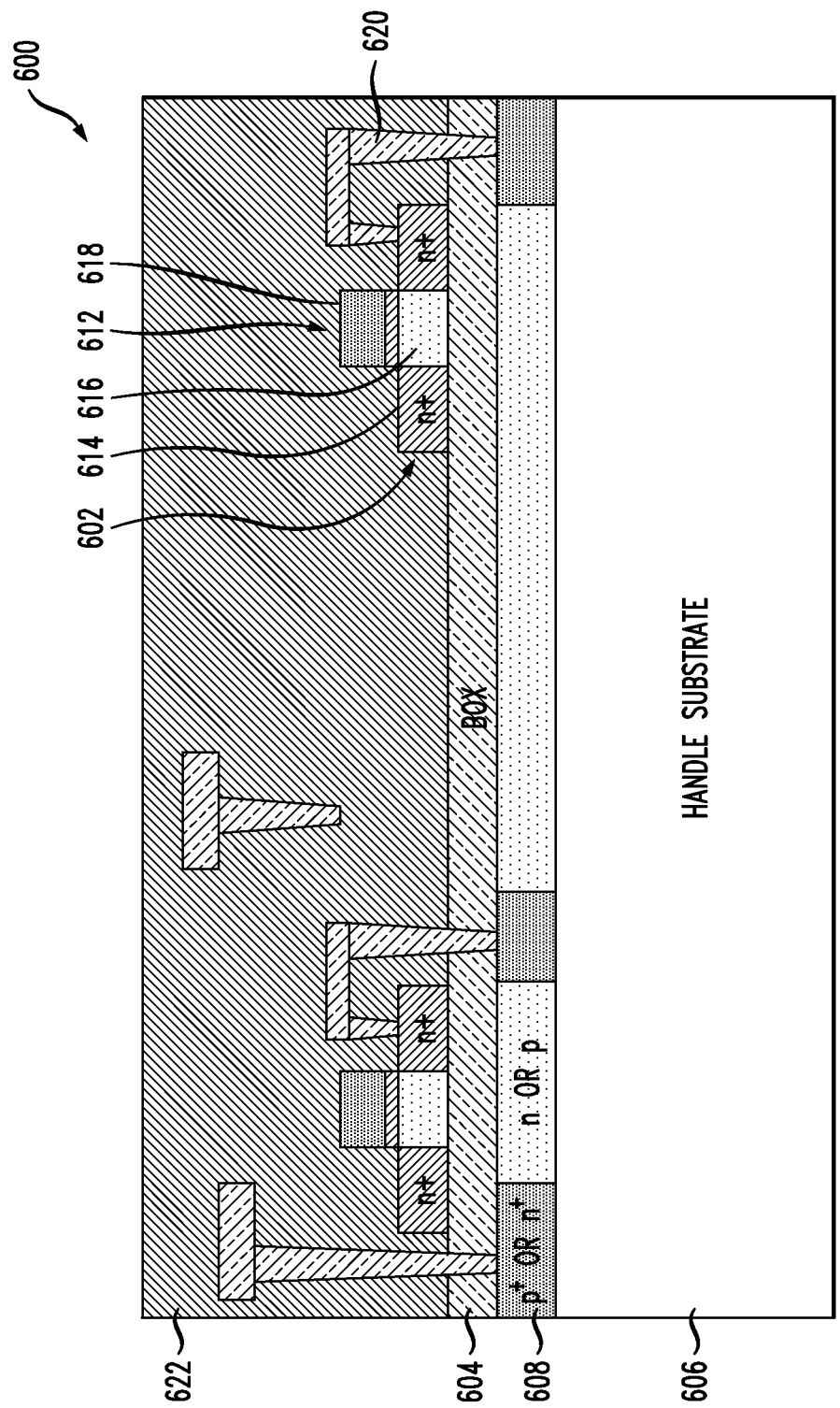
FIG. 18 is a schematic, sectional illustration showing a first structure obtained in fabricating an exemplary active matrix structure.

A silicon-on-insulator (SOI) wafer comprised of a thin crystalline semiconductor layer 602 on a buried oxide (BOX) insulator 604, which is in turn on a bulk silicon (handle) substrate 606 is employed in some embodiments as a starting substrate for fabricating backplanes including hybrid junction field-effect transistors, such as the transistors described above with respect to FIGS. 2 and 3. The hybrid transistors are characterized by their inclusion of inorganic (e.g. silicon-containing) channel layers and organic semiconductor gate junction layer(s). The thickness of the semiconductor layer 602 is between 20 nm-1 μm in some exemplary embodiments although thinner or thicker layers may be used as well. Relatively thin semiconductor layers facilitate the production of mechanically flexible active matrix structures. Exemplary single crystal materials for the crystalline semiconductor layer include silicon and silicon-containing films such as silicon germanium. Compound III-V and II-VI semiconductors may also be used. The insulator layer 604 in an exemplary embodiment is between 5-200 nm, but may also be thicker or thinner for some applications. The handle substrate 606 is subject to ion implantation through the BOX layer 604 to form an n or p-type semiconductor layer 608 beneath the BOX layer. Optionally, n+ or p+ contact regions 610 are also formed within the handle substrate via ion implantation. In one or more exemplary embodiments, boron or phosphorus doping (preferably greater than $10^{19}$ cm$^{-3}$ and more preferably greater than $10^{20}$ cm$^{-3}$) may be provided at selected areas of the handle substrate during fabrication of the SOI wafer 30 or prior to formation of the backplane components to form the highly doped contact regions 610. Ion implantation conducted through a mask can be employed to form the doped regions. The contact regions 610 are between 1-5 μm in depth in a crystalline silicon handle substrate in one or more embodiments. Conventional CMOS fabrication techniques are employed to form an array of transistors 612 on the wafer. The transistors 612 depicted in the exemplary structure 600 shown in FIG. 18 include doped source/drain regions 614 and a channel region 616 formed using the semiconductor layer 602 and a gate stack 618 on the channel region. Through silicon vias (TSVs) are formed. Metallization through the BOX layer 604 provides electrical connections 620 between the transistors 612 and the electrically conductive n+ or p+ regions 610. An electrically insulating layer 622 (e.g. dielectric material such as silicon dioxide) is formed on the wafer with additional metal layers as required.

The exemplary structure 600 is thereby obtained. Ion implantation of the semiconductor layer may be employed for the forming source/drain regions 614 while the regions of the semiconductor layer to be used as the channel regions 616 are protected by a mask. A high-k gate dielectric material is deposited and metal gate layers are formed to provide the gate stacks 618. The semiconductor layer is etched to form isolated portions ("islands") that define the active regions of the backplane. Device isolation is typically performed as one of the first steps in CMOS processing. Back end of line (BEOL) processing is conducted to form via conductors and other metal layers within a dielectric layer 622 serving as a passivation and/or planarization layer to form a backplane structure.

Figure 19:
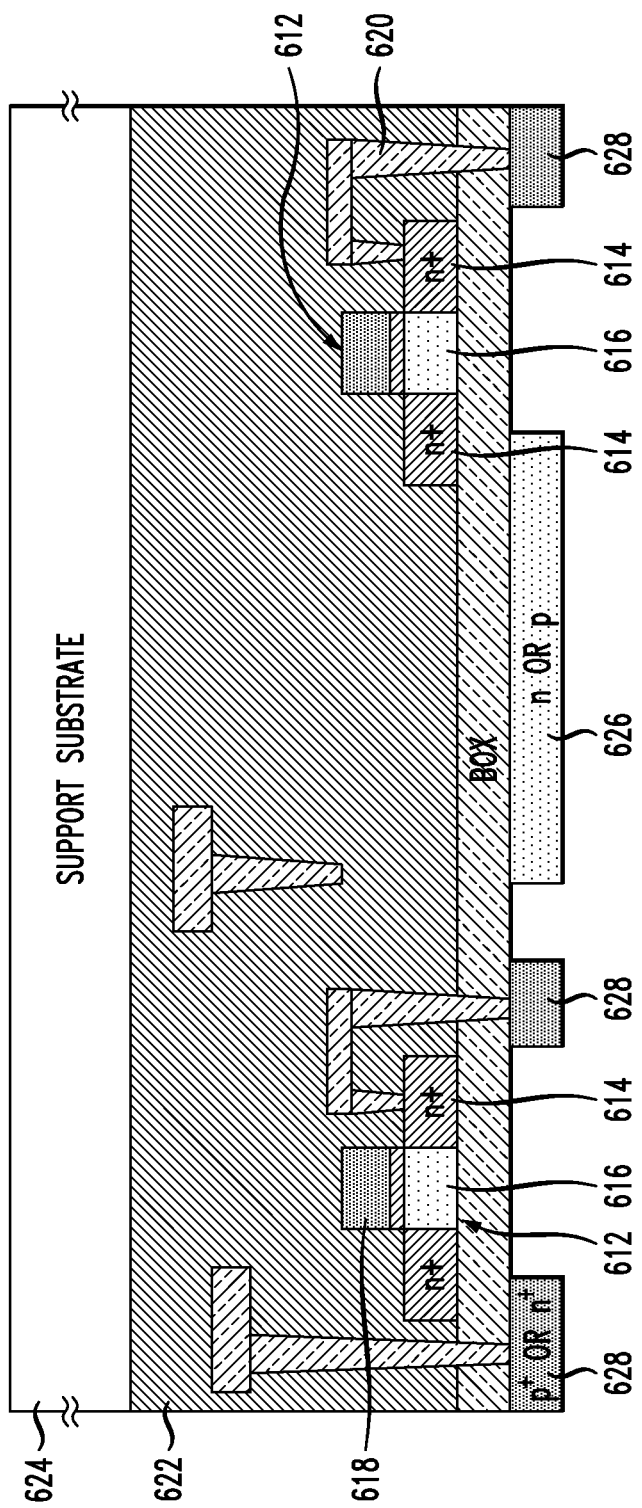
FIG. 19 is a schematic, sectional illustration showing a second structure obtained in fabricating an exemplary active matrix structure.

Referring to FIG. 19, a support substrate 624 is attached (e.g. bonded) to the electrically insulating layer 622 of the structure 600. The support substrate is preferably comprised of a flexible material such as plastic or metal foil in order to enable a flexible display; however, rigid substrates such as glass may also be used to form a rigid (non-flexible) display. The handle substrate 606 is removed back to the ion-implanted semiconductor layer 608. Such removal can be effected by a lapping process followed by chemical mechanical polishing (CMP) and/or etching. Controlled spalling followed by etching is another process for removing handle substrate material. If controlled spalling is employed, the support substrate 624 in some embodiments includes a stressor metal layer(s) (e.g. nickel) and a flexible handle substrate such as a polyimide layer. An optional insulator layer may be provided to prevent contact of the stressor layer with the electrically conductive elements of the backplane formed during BEOL (back end of line) processing. The flexible handle substrate (e.g. polyimide) is then used for detaching a thin layer of Si by spalling through the handle substrate 606. The proper amount of stress to be applied to effect spalling at a desired location in the handle substrate may vary depending on the construction of the portion of the backplane structure that includes the transistors 612.

As discussed above, controlled spalling is facilitated by selecting an appropriate insulating layer. If the electrically insulating layer 622 has a fracture toughness value comparable to silicon, to the first order, the silicon/insulator stack of the exemplary structure can be treated as a single layer in calculating the depth of fracture as a function of stress applied by the stressor layer(s). Therefore, a proper amount of stress can be considered for a desired fracture depth. If the insulating layer 622 has a toughness value larger than that of silicon, the fracture will occur inside the silicon. However, the insulating layer should not have a toughness value materially smaller than that of silicon (or other substrate material, if employed) because the fracture will occur within the insulating layer 622 instead of in the silicon handle substrate. The thickness of the metal stressor layer is an additional factor in determining where the fracture will occur in the substrate. Following spalling from the handle substrate, a thin residual silicon layer that includes the semiconductor layer 608 including the highly doped regions remains beneath the electrically insulating (BOX) layer. Stress-induced substrate spalling is disclosed in U.S. Pat. No. 8,247,261, which is incorporated by reference herein. The thin Si residual layer spalled from the handle substrate 606 is then removed using known techniques, e.g. by selective wet or dry etching. The doped semiconductor layer 608, including the optional highly doped regions 610, remains following such selective etching. The use of a p-type layer 608 facilitates the etching process in some embodiments as it functions as an etch stop layer. Techniques for removing the residual silicon layer include reactive ion etch and wet etch in TMAH or KOH (tetramethylammonium hydroxide or potassium hydroxide). The semiconductor layer is then patterned into active areas 626 and contact regions 628, the contact regions 628 being comprised of the previously formed highly doped regions 610.

Figure 20:
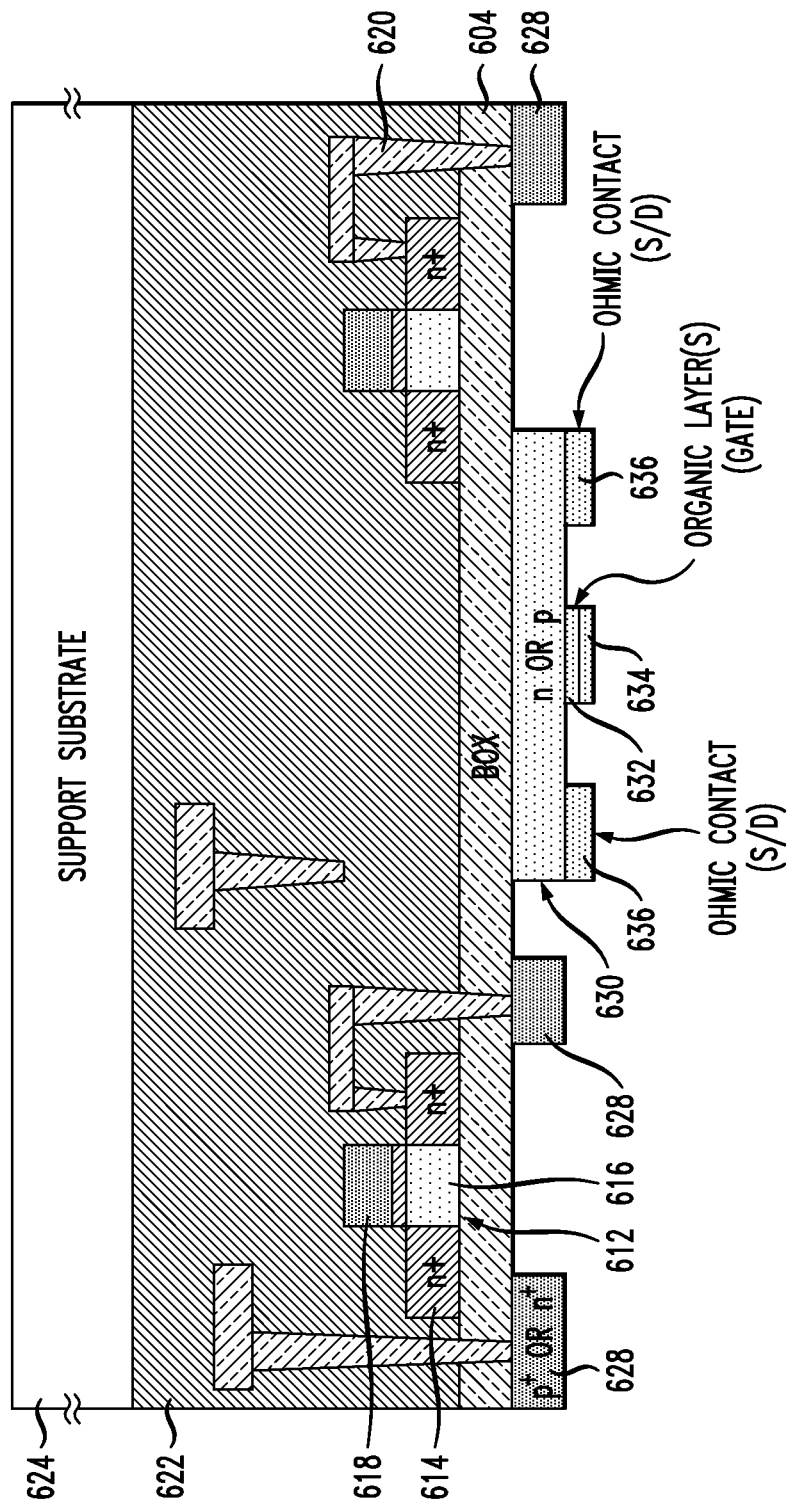
FIG. 20 is a schematic, sectional illustration showing a third structure obtained in fabricating an exemplary active matrix structure.

Referring to FIG. 20, hybrid JFETs 630 are formed on the active areas 626. In forming the JFETs, organic layer(s) 632 and a gate electrode 634 are formed on each active area. FIGS. 2 and 3 show exemplary organic gate junction structures including carrier transport layers and optional blocking and passivation layers. Ohmic contacts 636 are formed on the active areas. The exposed surfaces of the active areas are cleaned to remove the native oxide using, for example, hydrofluoric acid. Contact metal is deposited using one of several known techniques such as chemical vapor deposition (CVD), evaporation and sputtering. The contact metal may be deposited within a patterned photoresist layer (not shown) that is subsequently removed. Preferably a low workfunction metal such as erbium or magnesium is used to form ohmic contact to n-type silicon while a high workfunction metal such as gold, platinum, palladium or nickel is used to form ohmic contact to p-type silicon. Due to the high cost of rare and precious metals, in some embodiments, a thin layer of these materials (e.g. <3 nm) is deposited followed by a less expensive metal such as aluminum, chrome, titanium, copper or combinations thereof. The deposited contacts are optionally subjected to annealing up to a temperature compatible with the support substrate and the material used for bonding the support substrate (e.g. an adhesive material). In some embodiments, the optional annealing process may form a silicide.

Figure 21:
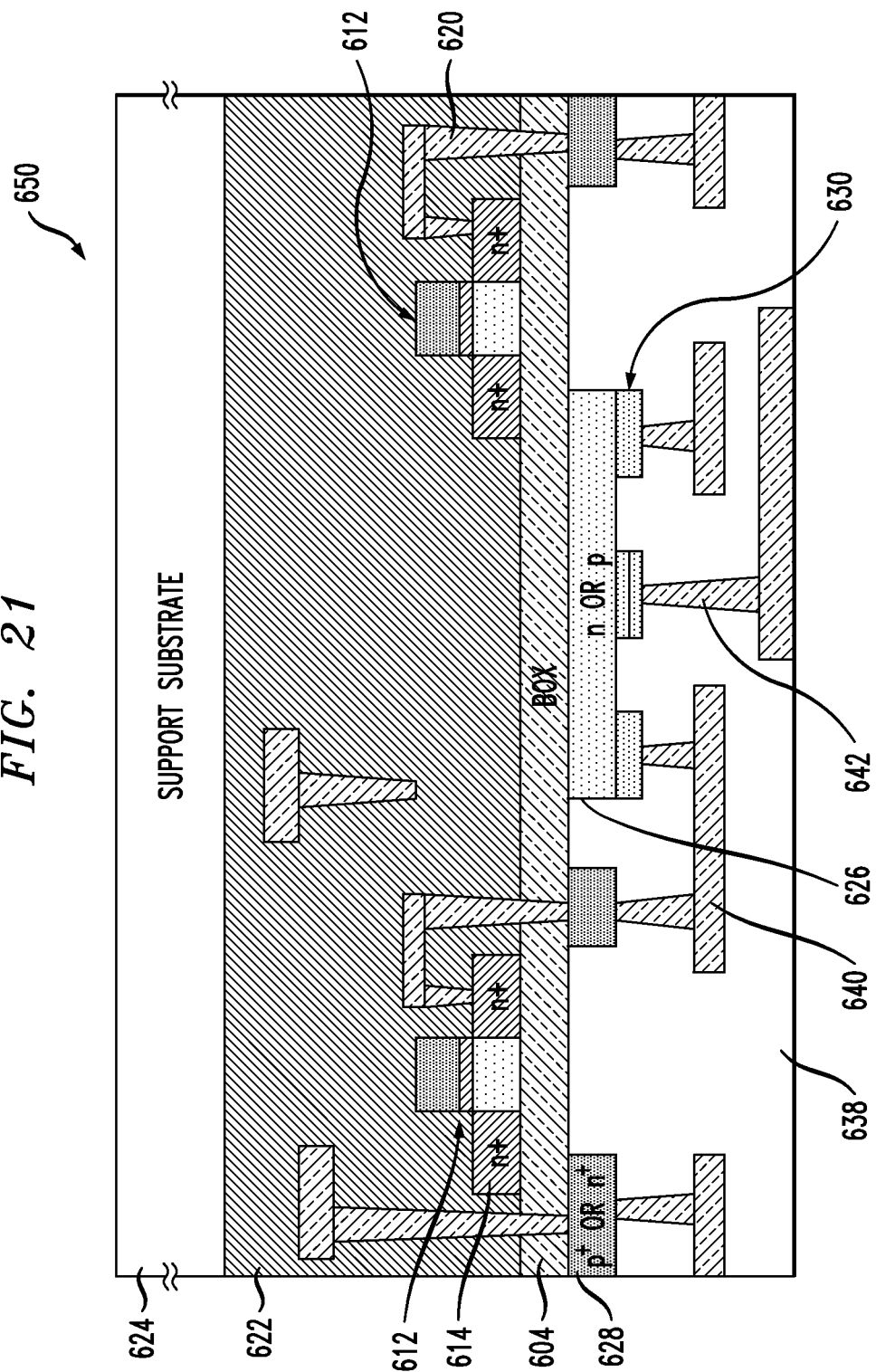
FIG. 21 is a schematic, sectional illustration showing a fourth structure obtained in fabricating an exemplary active matrix structure.

Following formation of an array of the JFETs 630, passivation and metallization steps are performed to provide a passivation layer 638 having metal layers 640 and via conductors 642. The JFETs 630, which function as the driver and/or switching transistors of the resulting backplane 650 shown in FIG. 21, are thereby electrically connected to the transistors (e.g. MOSFETs) on the opposite side of the BOX layer which form the control, hold and/or the scanning circuitry.

Figure 22:
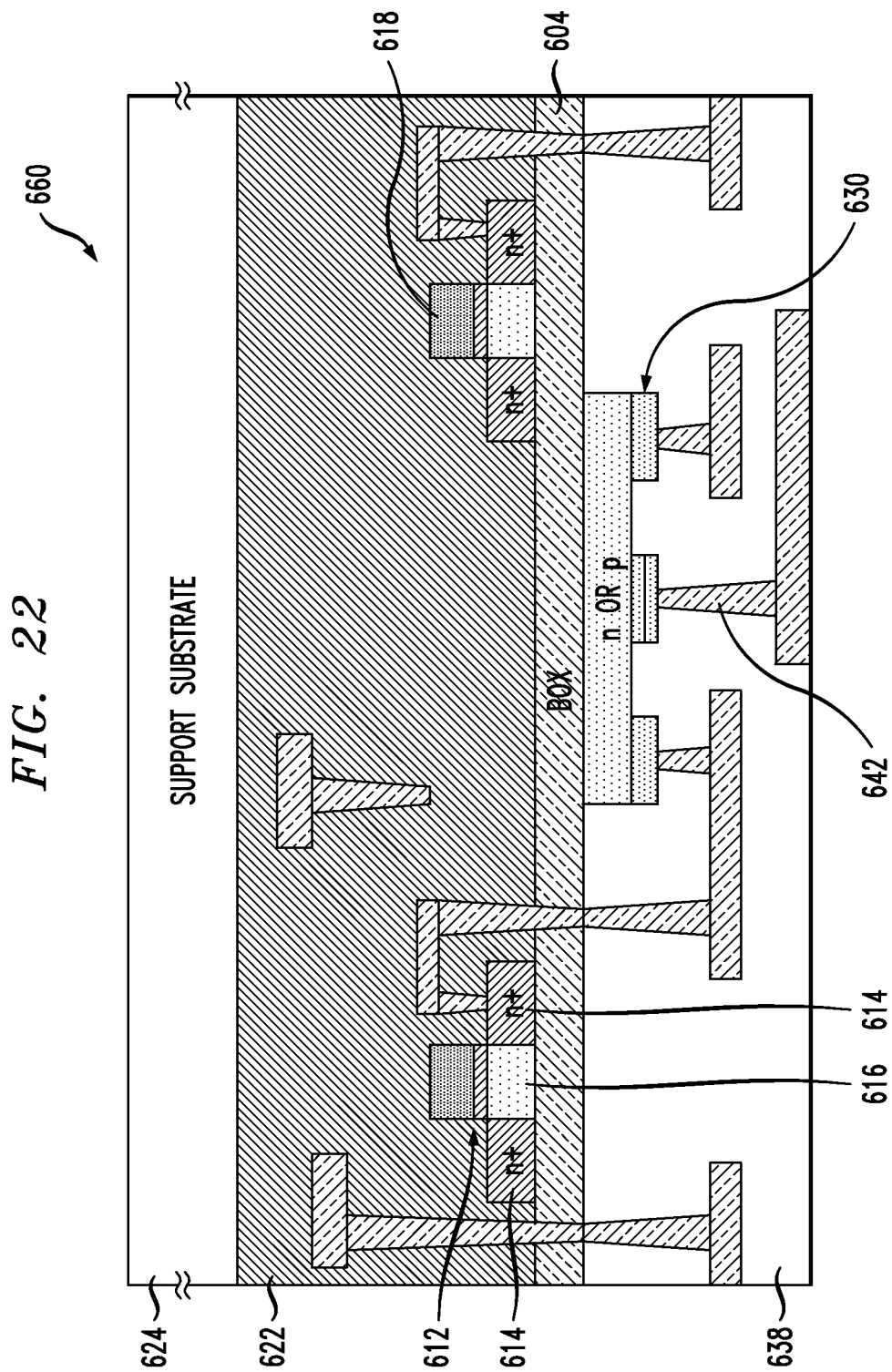
FIG. 22 is a schematic, sectional illustration showing a first alternative embodiment of an active matrix structure.

FIG. 22 shows an alternative embodiment of a backplane 660 provided in accordance with one or more embodiments. The same reference numerals used in the schematic illustration of the backplane 650 are employed to designate similar elements. In this exemplary embodiment, the highly doped contact regions 628 are omitted and direct metal-to-metal contact is made between via conductors formed on each side of the BOX layer.

Figure 23:
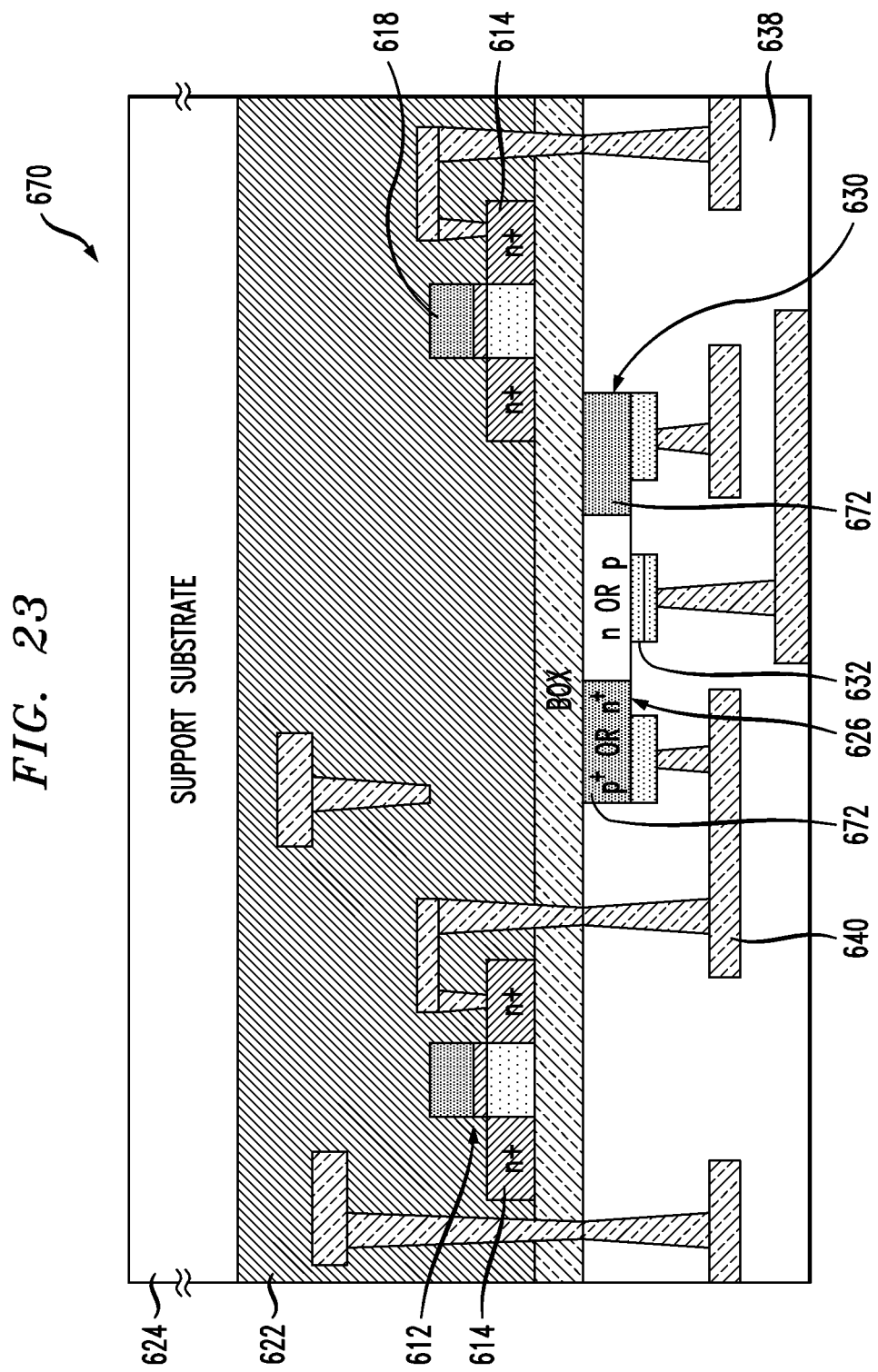
FIG. 23 is a schematic, sectional illustration showing a second alternative embodiment of an active matrix structure.

FIG. 23 shows a further alternative embodiment of a backplane 670 provided in accordance with one or more embodiments. The same reference numerals used in the schematic illustration of the backplane 650 are employed to designate similar elements in the alternative backplane 670. In this exemplary embodiment, highly doped source/drain regions 672 are formed within the active areas 626. Ion implantation through a mask can be employed to form the source/drain regions 672, leaving the channel region of the transistor at a lower doping level than the source/drain regions. The ohmic contacts 636 are formed on the source/drain regions 672. The highly doped source/drain regions 672 facilitate the formation of ohmic contacts 636 with a low contact resistance. As known in the art, a metal layer may form an ohmic contact to a highly doped silicon layer regardless of the workfunction of the metal layer. The doping concentration of the highly doped regions 672 is preferably larger than $10^{19}$ cm$^{-3}$ and more preferably larger than $10^{20}$ cm$^{3}$.

Figure 24:
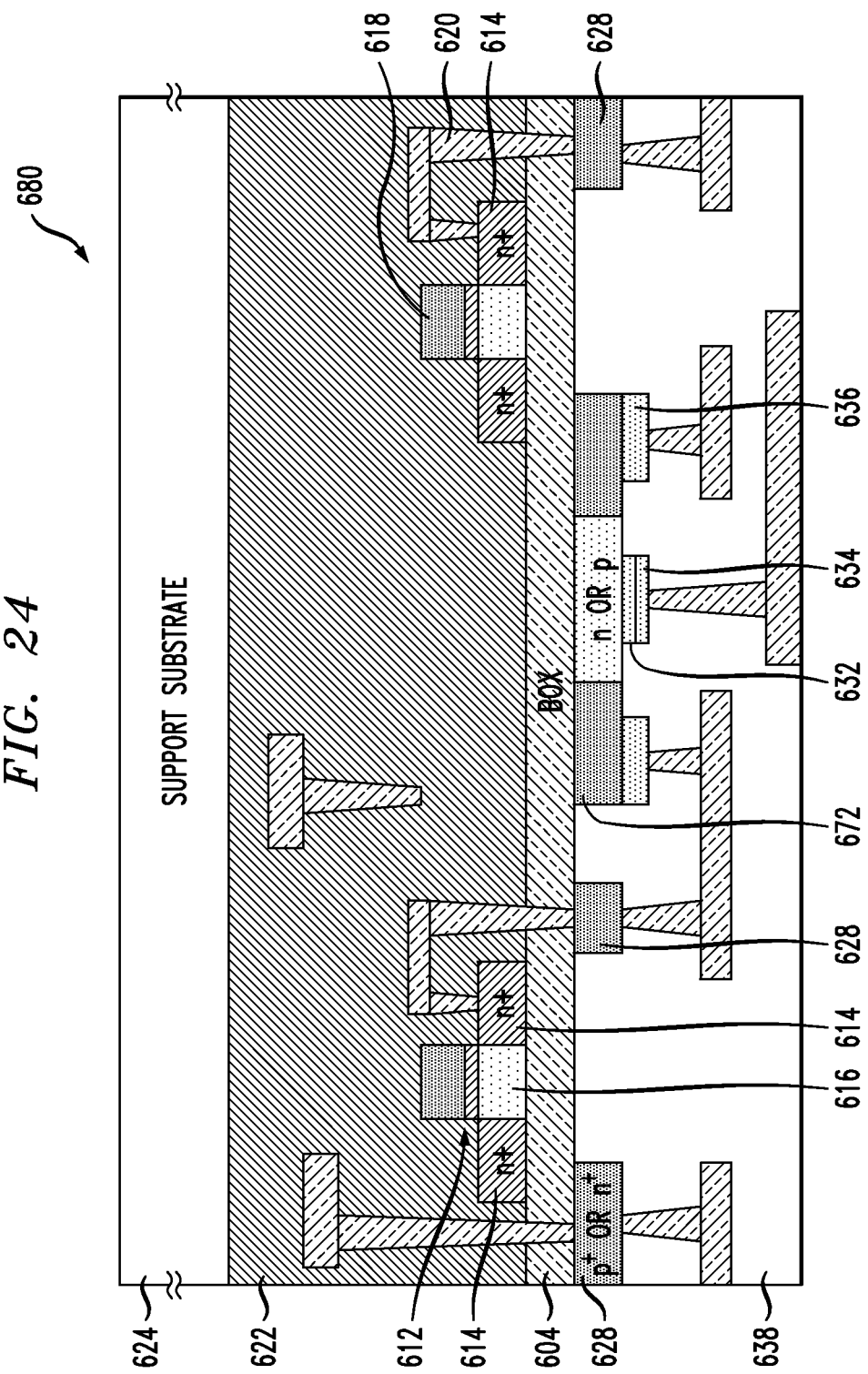
FIG. 24 is a schematic, sectional illustration showing a third alternative embodiment of an active matrix structure.
Figure 25A:
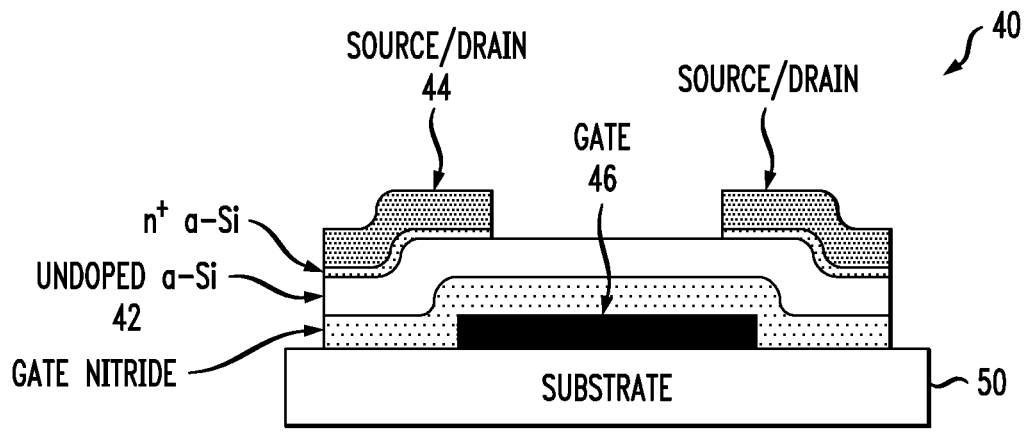
FIGS. 25A and 25B are schematic illustrations of prior art a-Si:H thin film transistors.
Figure 25B:
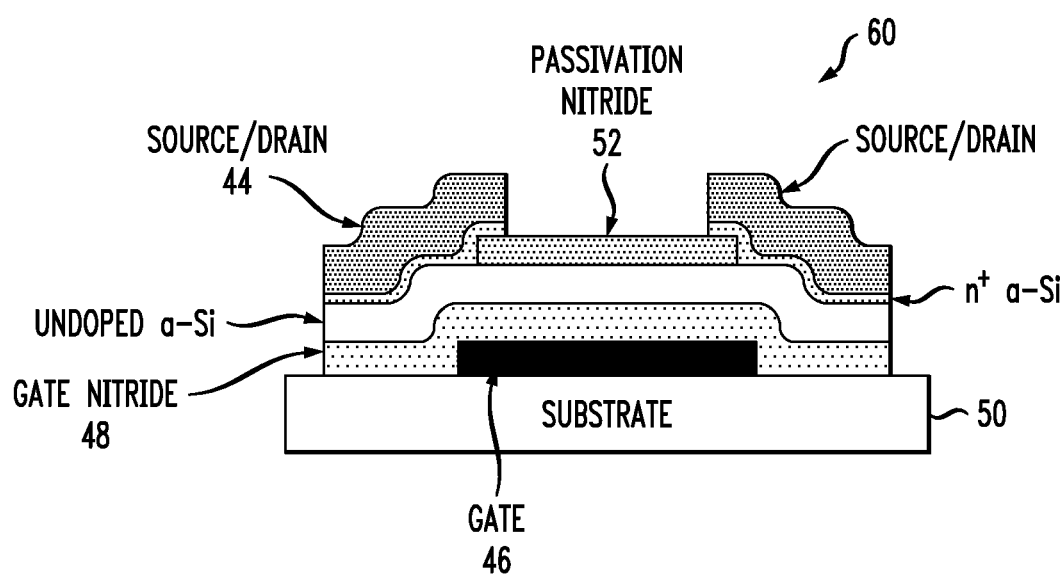

FIG. 24 shows a further alternative embodiment of a backplane 680 provided in accordance with one or more embodiments. The same reference numerals used in the schematic illustrations of the backplanes 650 and 670 are employed to designate similar elements in the alternative backplane 680. In this exemplary embodiment, highly doped regions are formed in the n or p-type semiconductor layer 608 to provide both source/drain regions 672 and contact regions 628 adjoining the BOX layer. The contact regions 628 and source/drain regions 672 are formed simultaneously in one or more embodiments through the same mask prior to formation of the CMOS transistors 612. The handle substrate is patterned into the active areas and contact regions 628. The ohmic contacts and gate structures are then formed on the source/drain and channel regions, respectively, of the resulting JFET transistors.

Given the discussion thus far and with reference to the exemplary embodiments discussed above and the drawings, it will be appreciated that, in general terms, an exemplary junction field-effect transistor is provided that includes a doped, inorganic semiconductor layer (32 in FIG. 2, 72 in FIG. 3), a gate electrode, an organic semiconductor blocking layer (36 in FIG. 2, 76 in FIG. 3) operatively associated with the gate electrode for suppressing the injection of charge carriers having a first charge type from the gate electrode towards the inorganic semiconductor layer, and ohmic contacts on the inorganic semiconductor layer. The carrier blocking layer 36, 76 is positioned between the gate electrode and the inorganic semiconductor layer. The exemplary junction field-effect transistor may further include a second blocking layer (38 in FIG. 2, 78 in FIG. 3) to suppress the injection of charge carriers having a second charge type from the inorganic substrate towards the gate electrode. The first charge carrier type corresponds to majority carriers in the inorganic substrate and the second charge type corresponds to minority carriers in the inorganic substrate. For example, if the inorganic substrate is n-type such as shown in FIG. 2, the majority carriers are electrons and the minority carriers are holes. A passivation layer is provided in one or more embodiments. The passivation layer saturates dangling bonds at the surface of the inorganic semiconductor substrate and reduces the thermal generation of electron-hole pairs at the surface of the substrate. The first organic semiconductor blocking layer includes pentacene in one or more embodiments where the inorganic substrate is n-type and the pentacene layer serves to block electrons. A gate junction structure comprising carrier blocking layer(s) and passivation layer consists essentially of organic materials in one or more embodiments.

An exemplary method includes obtaining a junction field-effect transistor including a doped inorganic semiconductor layer, a gate electrode, first and second ohmic contacts operatively associated with the inorganic semiconductor layer, and a gate junction structure operatively associated with the gate electrode. The gate junction structure is positioned between the gate electrode and the inorganic semiconductor layer and includes an organic semiconductor layer (e.g. electron blocking layer 36 in FIG. 2 or hole blocking layer 76 in FIG. 3) for suppressing the injection of charge carriers having a first charge type from the gate electrode into the inorganic semiconductor layer. The charge carriers having the first charge type correspond to majority carriers in the inorganic semiconductor layer. The method further includes causing the junction field-effect transistor to provide electrical current to an electronic device. The method may further include the step of suppressing injection of charge carriers having a second charge type from the inorganic semiconductor layer into the gate electrode.

An exemplary structure includes an array of junction field-effect transistors, each of the junction field-effect transistors including a doped inorganic semiconductor layer, a gate electrode, first and second ohmic contacts operatively associated with the inorganic semiconductor layer, and a gate junction structure operatively associated with the gate electrode. The gate junction structure is positioned between the gate electrode and the inorganic semiconductor layer and includes an organic semiconductor layer for suppressing the injection of the charge carriers having a first charge type from the gate electrode into the inorganic semiconductor layer. The charge carriers having the first charge type correspond to majority carriers in the inorganic semiconductor layer. The structure further includes an array of thin film switching transistors (e.g. transistors 204 in FIG. 11 or transistors 304 in FIG. 12), each of the thin film switching transistors being electrically connected to one of the junction field-effect transistors. An array of electronic devices is included in the exemplary structure, each of the electronic devices being electrically connected, for example by an ITO layer 218, to one of the junction field-effect transistors.

A further exemplary method includes obtaining a substrate including a first inorganic semiconductor layer 602, a handle substrate 606, and an electrically insulating layer 604 between the first inorganic semiconductor layer and the handle substrate. A doped, second inorganic semiconductor layer 608 is formed from a region of the handle substrate adjoining the electrically insulating layer. An array of transistors 612 is formed using the first inorganic semiconductor layer. The method further includes forming a plurality of via conductors 620 through the electrically insulating layer 604, at least some of the via conductors being electrically connected to the transistors 612, forming a protective layer 622 over the transistors, attaching a support substrate 624 (FIG. 19) to the protective layer, forming a plurality of discrete active areas 626 from the doped, second inorganic semiconductor layer, and forming an array of junction field-effect transistors 630 using the discrete active areas, such as shown in FIG. 20. Each junction field-effect transistor includes a gate junction structure (organic layer(s) 632) directly contacting one of the active areas, a gate electrode 634 on the gate junction structure, and ohmic contacts 636. Each gate junction structure includes an organic semiconductor layer for suppressing the injection of the charge carriers having a first charge type from the gate electrode 634 into the inorganic semiconductor layer. The charge carriers having the first charge type correspond to majority carriers in the doped, second inorganic semiconductor layer. The method further includes forming a second protective layer 638 over the junction field-effect transistors 630 and forming a plurality of electrical conductors 640 within the second protective layer electrically connecting the junction field-effect transistors to the via conductors electrically connected to the first array of transistors. A structure as shown in at least one of FIGS. 21-24 can accordingly be obtained. In one or more embodiments, the method further includes the steps of forming a second semiconductor layer within each gate junction structure for suppressing the injection of charge carriers having a second charge type into the gate electrode, the second charge type corresponding to minority carriers in the doped, second inorganic semiconductor layer, and forming a passivating layer within each gate junction structure directly on the active area. Gate junction structures as shown in the exemplary embodiments of FIG. 2 or 3 can accordingly be provided within one or more of the structures shown in FIGS. 21-24. Highly doped contact regions 628 are formed in some embodiments. Highly doped source/drain regions 672 are formed in the active areas in one or more embodiments such as the embodiment 670 of FIG. 23.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Terms such as "above", "below", "top" and "bottom" are generally employed to indicate relative positions as opposed to relative elevations unless otherwise indicated. It should also be noted that, in some alternative implementations, the steps of the exemplary methods may occur out of the order noted in the figures. For example, two steps shown in succession may, in fact, be executed substantially concurrently, or certain steps may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
   obtaining a junction field-effect transistor including:
   a doped inorganic semiconductor layer;
   a gate electrode;
   first and second ohmic contacts operatively associated with the inorganic semiconductor layer;
   and a gate junction structure operatively associated with the gate electrode, the gate junction structure being positioned between the gate electrode and the inorganic semiconductor layer and including an organic semiconductor layer for suppressing the injection of charge carriers having a first charge type from the gate electrode into the inorganic semiconductor layer, the charge carriers having the first charge type corresponding to majority carriers in the inorganic semiconductor layer, and
   causing the junction field-effect transistor to provide electrical current to an electronic device.

2. The method of claim 1, wherein the electronic device is an organic light emitting diode and the step of causing the junction field-effect transistor to provide electrical current to the electronic device further includes causing a switching thin film transistor to send an electrical signal to the junction field-effect transistor.

3. The method of claim 2, wherein the step of suppressing the injection of charge carriers having the first charge type into the inorganic semiconductor layer from the gate junction includes suppressing electron injection, and further including the step of suppressing injection of holes from the inorganic semiconductor layer into the gate electrode.

4. A method comprising:
obtaining a substrate including a first inorganic semiconductor layer, a handle substrate, and an electrically insulating layer between the first inorganic semiconductor layer and the handle substrate;
forming a doped, second inorganic semiconductor layer from a region of the handle substrate adjoining the electrically insulating layer;
forming an array of transistors using the first inorganic semiconductor layer;
forming a plurality of via conductors through the electrically insulating layer, at least some of the via conductors being electrically connected to the transistors;
forming a protective layer over the transistors;
attaching a support substrate to the protective layer;
forming a plurality of discrete active areas from the doped, second inorganic semiconductor layer;
forming an array of junction field-effect transistors using the discrete active areas, each junction field-effect transistor including a gate junction structure directly contacting one of the active areas, a gate electrode on the gate junction structure, and ohmic contacts, each gate junction structure including an organic semiconductor layer for suppressing the injection of the charge carriers having a first charge type from the gate electrode into the inorganic semiconductor layer, the charge carriers having the first charge type corresponding to majority carriers in the doped, second inorganic semiconductor layer;
forming a second protective layer over the junction field-effect transistors, and
forming a plurality of electrical conductors within the second protective layer electrically connecting the junction field-effect transistors to the via conductors electrically connected to the first array of transistors.

5. The method of claim 4, further including the steps of forming a second semiconductor layer within each gate junction structure for suppressing the injection of charge carriers having a second charge type into the gate electrode, the second charge type corresponding to minority carriers in the doped, second inorganic semiconductor layer, and forming a passivating layer within each gate junction structure directly on the active area.

6. The method of claim 5, wherein the first inorganic semiconductor layer and the doped, second inorganic semiconductor layer comprise mono-crystalline silicon, further including forming highly doped contact regions in the handle substrate and adjoining the electrically insulating layer such that the highly doped contact regions are electrically connected to a plurality of the via conductors.

7. The method of claim 5, further including the step of forming highly doped source/drain regions in the active areas and forming the ohmic contacts on the highly doped source/drain regions.

* * * * *